(12) United States Patent
Jang

(10) Patent No.: US 12,543,455 B2
(45) Date of Patent: Feb. 3, 2026

(54) DISPLAY PANEL

(71) Applicant: Samsung Display Co., Ltd., Yongin-Si (KR)

(72) Inventor: Cheol Jang, Uiwang-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 487 days.

(21) Appl. No.: 17/701,435

(22) Filed: Mar. 22, 2022

(65) Prior Publication Data

US 2023/0008830 A1    Jan. 12, 2023

(30) Foreign Application Priority Data

Jul. 8, 2021    (KR) .................... 10-2021-0089953

(51) Int. Cl.
*H10K 59/131*    (2023.01)
*G09G 3/3275*    (2016.01)
*H10K 59/126*    (2023.01)

(52) U.S. Cl.
CPC ......... *H10K 59/131* (2023.02); *G09G 3/3275* (2013.01); *H10K 59/126* (2023.02)

(58) Field of Classification Search
CPC ............. H10K 59/1201; H10K 59/124; H10K 59/1213; H10K 59/123; H10K 59/126; H10K 59/131; H10K 59/35; H10K 59/10; H10K 59/121; H10K 59/122; H10K 59/805; H10K 59/80515; H10K 59/8052; H10K 59/80522; H10K 59/82; H10K 59/873; H10K 59/8731; H01L 27/1255; H01L 27/3276; H01L 27/3211; H01L 27/1214–1296; H01L 27/124; H01L 27/32; H01L 27/3293; H01L 27/3297; G09G 2300/0426; G09G 2300/0842; G09G 2300/0819; G09G 2300/08452; G09G 2300/0861; G09G 3/3275; G09G 3/3233; G09G 2330/12; G09G 2300/0452
USPC .................... 257/40, 48, 59, 88, 89, E23.01
See application file for complete search history.

(56) References Cited

U.S. PATENT DOCUMENTS

| | | |
|---|---|---|
| 10,573,704 B2 | 2/2020 | Cai |
| 10,847,732 B2 | 11/2020 | Bai et al. |
| 2017/0069705 A1* | 3/2017 | Cao ................. H10K 59/80522 |
| 2017/0373128 A1* | 12/2017 | Lee ...................... H10K 59/131 |
| 2018/0366586 A1* | 12/2018 | Son .................... H01L 27/1218 |
| 2019/0148476 A1 | 5/2019 | Park et al. |
| 2019/0267440 A1* | 8/2019 | Park ..................... H10K 50/828 |

(Continued)

FOREIGN PATENT DOCUMENTS

| KR | 10-2017-0039537 A | 4/2017 |
|---|---|---|
| KR | 10-2019-0055868 A | 5/2019 |
| KR | 10-2021-0008977 A | 1/2021 |

*Primary Examiner* — Natalia A Gondarenko
(74) *Attorney, Agent, or Firm* — Innovation Counsel LLP

(57) ABSTRACT

Provided is a display device including a first pixel and a second pixel. The light-emitting element and driving circuit of the second pixel are disposed in a second region. The first pixel includes a silicon transistor and an oxide transistor which are disposed in the second region. The first pixel includes a connection line configured to electrically connect one of the transistors and the light-emitting element disposed in a first region. The connection line is disposed in the same layer as an oxide semiconductor pattern and includes a transparent conductive oxide.

19 Claims, 16 Drawing Sheets

(56) References Cited

U.S. PATENT DOCUMENTS

2020/0201391 A1* 6/2020 Bai .................... H10K 50/844
2020/0279897 A1* 9/2020 Nendai ................ H10K 50/81

* cited by examiner

DISPLAY PANEL

CROSS-REFERENCE TO RELATED APPLICATIONS

This U.S. non-provisional patent application claims priority under 35 U.S.C. § 119 to Korean Patent Application No. 10-2021-0089953, filed on Jul. 8, 2021, the entire contents of which are hereby incorporated by reference.

BACKGROUND

The present disclosure herein relates to a display panel having improved flexibility.

Electronic devices such as smart phones, tablets, notebook computers, car navigation systems, and smart televisions are being developed. These electronic devices are provided with a display device in order to provide information.

Various types of display devices are being developed to satisfy user experience (UX) and user interface (UI) requirements. Among the display devices, the development of flexible display devices is actively underway.

SUMMARY

The present disclosure provides a display panel having improved impact resistance.

An embodiment of the inventive concept provides a display panel including: a base layer including a boundary region and a pixel region; a pixel circuit disposed in the pixel region to overlap the pixel region; a plurality of insulating layers disposed on the base layer, the plurality of insulating layers including an opening disposed in a region corresponding to the boundary region; a first organic layer disposed on the plurality of insulating layers to fill the opening; a light-emitting element overlapping the pixel region, electrically connected to the pixel circuit, and disposed on the first organic layer; and a first conductive line disposed in the boundary region to overlap the boundary region, extending in substantially the same direction as the boundary region, disposed on the first organic layer, and electrically connected to the pixel circuit.

In an embodiment, the boundary region may include a first region extending in a first direction and a second region extending in a second direction crossing the first direction. The opening comprises a first opening region extending in the first direction to overlap the first region and a second opening region extending in the second direction to overlap the second region. The first conductive line may extend in the first direction or in the second direction.

In an embodiment, the display panel may further include a second organic layer disposed on the first organic layer and a second conductive line disposed on the second organic layer. The first conductive line may extend in the first direction, and the second conductive line may extend in the second direction.

In an embodiment, the display panel may further include a second organic layer disposed on the first organic layer and a second conductive line disposed on the second organic layer. The first conductive line may be disposed in the first region to overlap the first opening region, and the second conductive line may be disposed in the second region to overlap the second opening region.

In an embodiment, the second conductive line may be connected to the first conductive line through a contact hole formed through the second organic layer in the boundary region.

In an embodiment, the display panel may further include a second organic layer disposed on the first organic layer and a second conductive line disposed on the second organic layer. The first conductive line and the second conductive line may be disposed in the boundary region which are different from each other.

In an embodiment, the first conductive line and the second conductive line may receive signals or voltages which are different from each other.

In an embodiment, the pixel circuit may include a silicon transistor or an oxide transistor.

In an embodiment, the first conductive line may receive a data signal or a power voltage.

In an embodiment, the display panel may further include a data driving circuit electrically connected to the first conductive line. The boundary region may include a first region extending in a first direction and a second region extending in a second direction crossing the first direction.

In an embodiment, the opening may include a first opening region extending in the first direction to overlap the first region and a second opening region extending in the second direction to overlap the second region.

In an embodiment, the first conductive line may include a first line disposed in the first region to overlap the first opening region and a second line disposed in the second region to overlap the second opening region.

In an embodiment, the pixel region may include a plurality of pixel regions, the boundary region may surround each of the plurality of pixel regions in a plan view, and the number of the light-emitting element disposed in each of the plurality of pixel regions may be one, two, or four.

In an embodiment, the display panel may further include a second conductive line. The second conductive line may include a first conductive pattern overlapping the pixel region and disposed under the first organic layer, and a second conductive pattern disposed on the first organic layer, the second conductive pattern connecting first conductive patterns disposed adjacent to each other with the boundary region disposed between the first conductive patterns.

In an embodiment, the pixel circuit may include a first transistor including a first gate and a silicon semiconductor pattern, and a second transistor including a second gate and an oxide semiconductor pattern.

In an embodiment, the plurality of insulating layers may include a buffer inorganic layer disposed under the silicon semiconductor pattern, a first inorganic layer disposed on the silicon semiconductor pattern, a second inorganic layer disposed on the first inorganic layer and the first gate, a third inorganic layer disposed between the second inorganic layer and the oxide semiconductor pattern, a fourth inorganic layer disposed on the third inorganic layer and the oxide semiconductor pattern, and a fifth inorganic layer disposed on the fourth inorganic layer and the second gate.

In an embodiment, the fourth inorganic layer may be disposed under the second gate to overlap the second gate, the fourth inorganic layer exposing the first transistor.

In an embodiment of the inventive concept, a display panel may include: a base layer including a boundary region and a pixel region; a pixel circuit disposed in the pixel region to overlap the pixel region; a plurality of inorganic layers disposed on the base layer, the plurality of insulating layers including an opening disposed in a region corresponding to the boundary region; an organic pattern disposed on the plurality of inorganic layers to fill the opening; a light-emitting element overlapping the pixel region, electrically connected to the pixel circuit, and disposed on the plurality of inorganic layers; and a conductive line disposed in the boundary region to overlap the boundary region, extending in substantially the same direction as the boundary region, disposed on the organic pattern, and electrically connected to the pixel circuit.

In an embodiment, the display panel may further include an insulating layer disposed on the plurality of inorganic layers, the insulating layer including a first opening exposing the organic pattern. The conductive line may be disposed to cover the first opening.

In an embodiment, a portion of the organic pattern may be disposed on the uppermost inorganic layer among the plurality of inorganic layers.

In an embodiment, the conductive line may be in contact with the upper surface of the organic pattern.

In an embodiment, the display panel may further include an insulating layer disposed on the plurality of inorganic layers. The conductive line may include a first conductive line and a second conductive line which cross each other. The insulating layer may be disposed between the first conductive line and the second conductive line. The organic pattern may include a first organic pattern extending in a first direction to overlap the first conductive line, and a second organic pattern extending in a second direction to overlap the second conductive line. The first conductive line and the second conductive line may be connected to each other through a contact hole formed through the insulating layer.

In an embodiment of the inventive concept, a display panel may include: a base layer including a first pixel region, a second pixel region, and a boundary region disposed between the first pixel region and the second pixel region; a first stack structure disposed corresponding to the first pixel region; a second stack structure disposed corresponding to the second pixel region and disposed to be spaced apart from the first stack structure with the boundary region interposed therebetween; an organic material which fills at least a space between the first stack structure and the second stack structure and overlaps the boundary region; a transistor and a light-emitting element which are disposed in the first pixel region; and a conductive line disposed on the organic material, extending in substantially the same direction as the boundary region, and electrically connected to the transistor or the light-emitting element. Each of the first stack structure and the second stack structure may include a plurality of inorganic layers.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
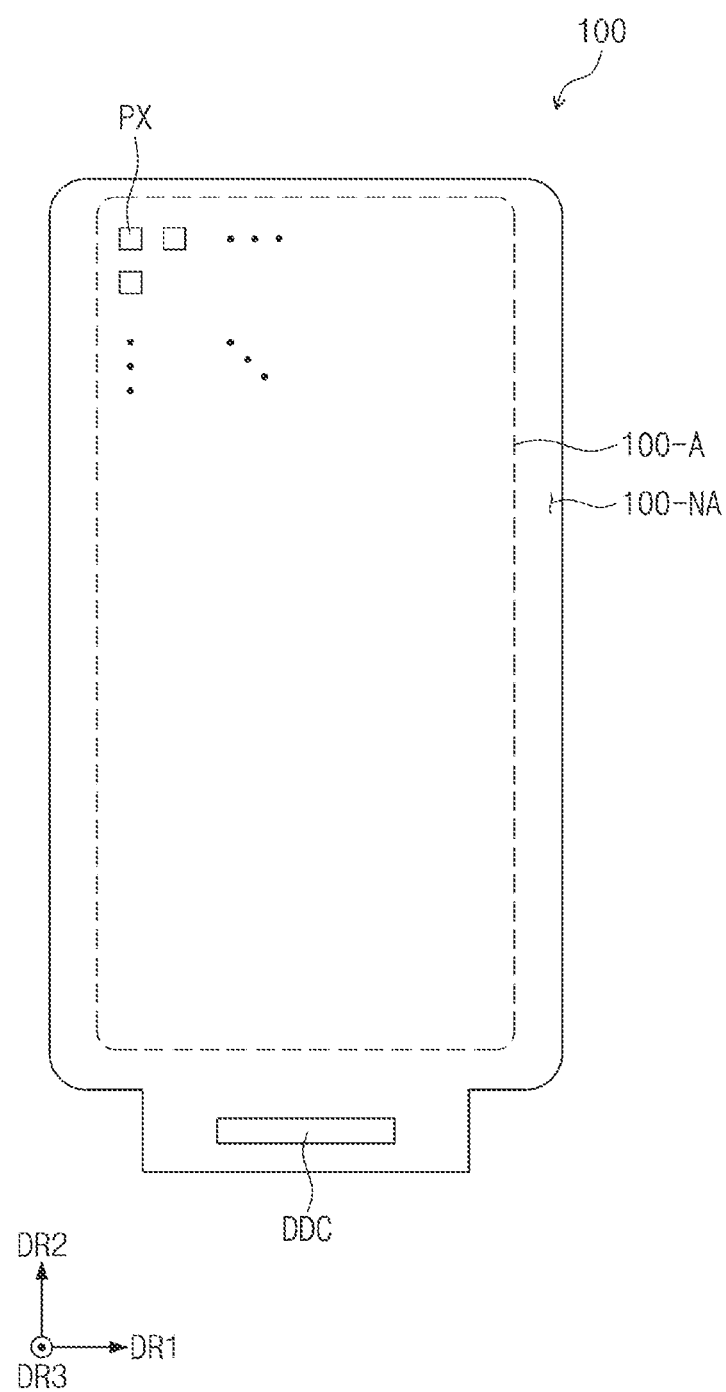
FIG. 1 is a plan view of a display panel according to an embodiment of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated elements can define.

It will be understood that, although the terms first, second, etc. may be used herein to describe various elements, these elements should not be limited by these terms. These terms are only used to distinguish one element from another element. For example, a first element could be termed a second element without departing from the scope of the present inventive concept. Similarly, the second element may also be referred to as the first element. The terms of a singular form include plural forms unless otherwise specified.

Terms, such as "below", "lower", "above", and "upper", are used herein for ease of description to describe one element's relation to another element(s) as illustrated in the drawings. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Figure 2:
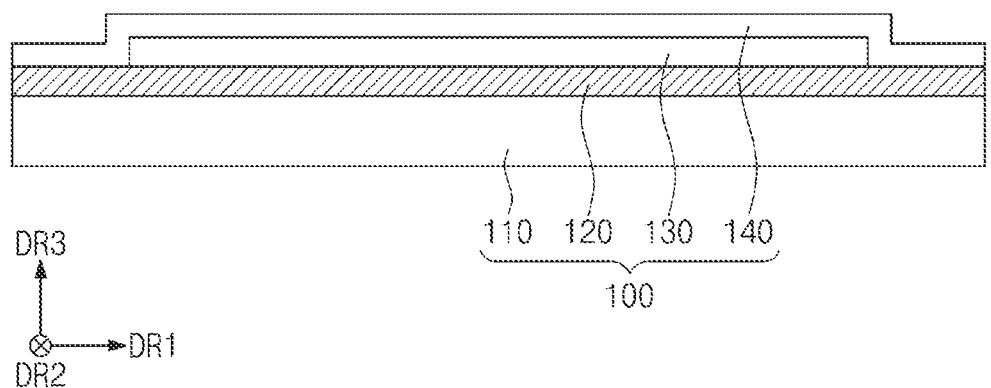
FIG. 2 is a cross-sectional view of the display panel according to an embodiment of the inventive concept.

FIG. 1 is a plan view of a display panel 100 according to an embodiment of the inventive concept. FIG. 2 is a cross-sectional view of the display panel 100 according to an embodiment of the inventive concept.

Referring to FIG. 1, the display panel 100 may include a display region 100-A and a non-display region 100-NA. The non-display region 100-NA may be disposed adjacent to the display region 100-A and surround at least a portion of the display region 100-A. Pixels PX are disposed in the display region 100-A and the pixels PX are not disposed in the non-display region 100-NA. A data driving circuit DDC may be disposed on one side of the non-display region 100-NA.

The display region 100-A may include a plane defined by a first direction DR1 and a second direction DR2. The thickness direction of the display panel 100 may be a third direction DR3 that is the normal direction of the display region 100-A. The front surface (or upper surface) and the rear surface (or lower surface) of elements constituting the display panel 100 may be defined based on the third direction DR3.

The display panel 100 may be a light-emitting display panel. For example, the display panel 100 may be an organic light-emitting display panel, an inorganic light-emitting display panel, a micro LED display panel, or a nano LED display panel.

As illustrated in FIG. 2, the display panel 100 may include a base layer 110, a circuit layer 120, a light-emitting element layer 130, and an encapsulation layer 140. Another functional layer may be further disposed between two adjacent layers among the base layer 110, the circuit layer 120, the light-emitting element layer 130, and the encapsulation layer 140.

The base layer 110 may provide a base surface on which the circuit layer 120 is disposed. The base layer 110 may be a flexible substrate capable of bending, folding, rolling, or the like. The base layer 110 may be a glass substrate, a metal substrate, or a polymer substrate. However, the embodiment of the inventive concept is not limited thereto, and the base layer 110 may be an inorganic layer, an organic layer, or a composite material layer.

The base layer 110 may have a multi-layered structure. For example, the base layer 110 may include a first synthetic resin layer, a multi-layered or single-layered inorganic layer, and a second synthetic resin layer disposed on the multi-layered or single-layered inorganic layer. Each of the first and second synthetic resin layers may include a polyimide-based resin, and the embodiment of the inventive concept is not particularly limited.

The circuit layer 120 may be disposed on the base layer 110. The circuit layer 120 may include an insulating layer, a semiconductor pattern, a conductive pattern, a signal line, and the like.

The light-emitting element layer 130 may be disposed on the circuit layer 120. The light-emitting element layer 130 may include a light-emitting element. For example, the light-emitting element may contain an organic light-emitting material, an inorganic light-emitting material, an organic-inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stack structure of an inorganic layer, an organic layer, and an inorganic layer.

Figure 3:
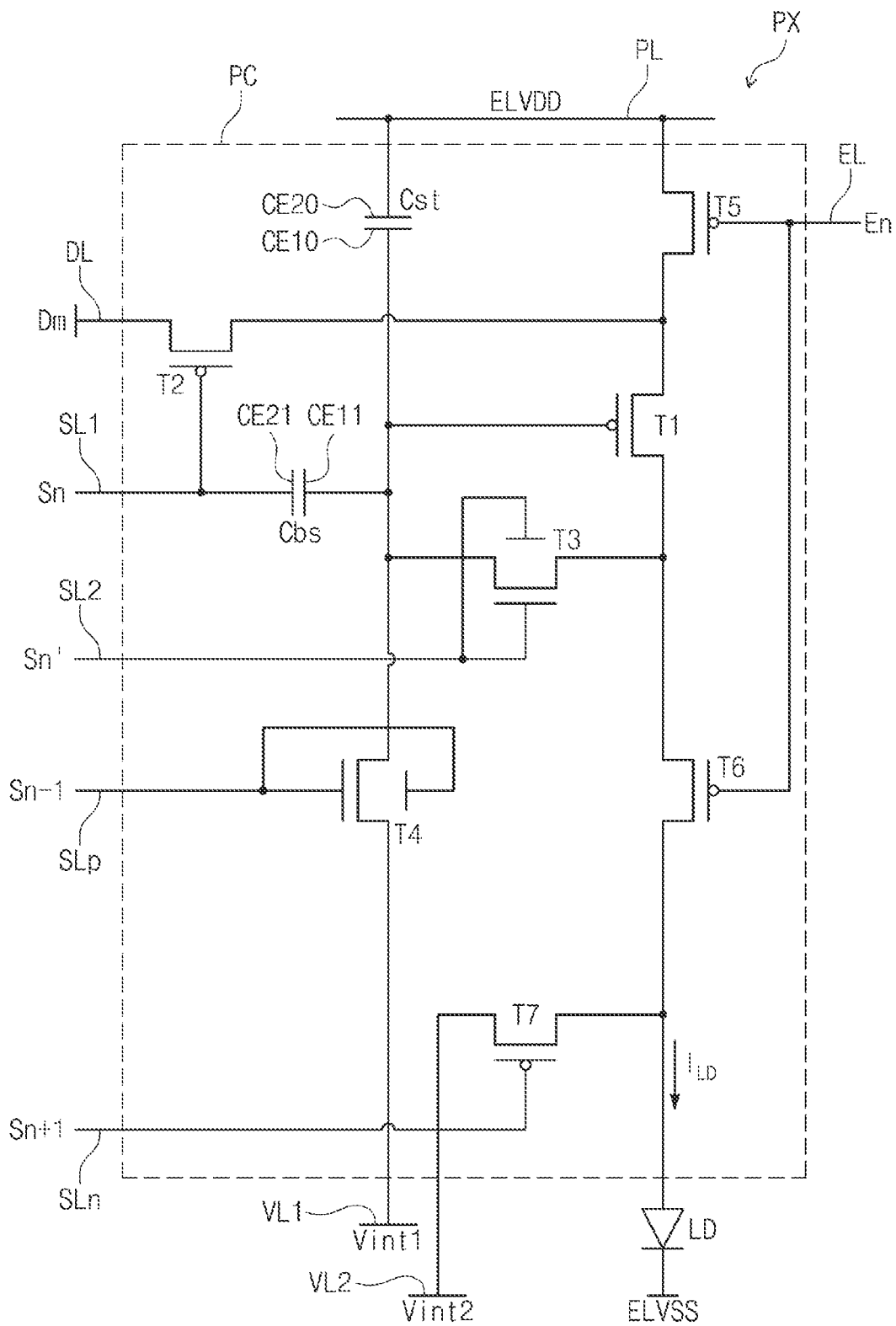
FIG. 3 is an equivalent circuit diagram of a pixel according to an embodiment of the inventive concept.

FIG. 3 is an equivalent circuit diagram of a pixel PX according to an embodiment of the inventive concept.

Referring to FIG. 3, the pixel PX may include a light-emitting element LD and a pixel circuit PC. The light-emitting element LD may be included in the light-emitting element layer 130 of FIG. 2, and the pixel circuit PC may be included in the circuit layer 120 of FIG. 2. The pixel circuit PC is connected to a plurality of conductive lines SL1, SL2, SLp, SLn, EL, DL, VL1, VL2, and PL. The plurality of conductive lines SL1, SL2, SLp, SLn, EL, DL, VL1, VL2, and PL may include scan lines SL1, SL2, SLp, and SLn, a light-emitting control line EL, a data line DL, a first initialization voltage line VL1, a second initialization voltage line VL2, and a power voltage line PL. The plurality of conductive lines SL1, SL2, SLp, SLn, EL, DL, VL1, VL2, and PL may be components included in the circuit layer 120 of FIG. 2.

The pixel circuit PC may include a plurality of transistors T1 to T7 (or thin-film transistors) and a storage capacitor Cst. The plurality of transistors T1 to T7 may include a driving transistor T1 (or a first transistor), a switching transistor T2 (or a second transistor), a compensation transistor T3 (or a third transistor), a first initialization transistor T4 (or a fourth transistor), an operation control transistor T5 (or fifth transistor), a light-emitting control transistor T6 (or sixth transistor), and a second initialization transistor T7 (or a seventh transistor). The light-emitting element LD may include a first electrode (e.g. an anode electrode or a pixel electrode) and a second electrode (e.g. a cathode electrode or a common electrode), and the first electrode of the light-emitting element LD may be connected to the driving transistor T1 via the light-emitting control transistor T6 to receive a driving current $I_{LD}$, and the second electrode thereof may receive a low power voltage ELVSS. The light-emitting element LD may generate light having a luminance corresponding to the driving current $I_LD$.

Some of the plurality of transistors T1 to T7 may be n-channel MOSFETs (NMOS), and the others thereof may be p-channel MOSFETs (PMOS). For example, the compensation transistor T3 and the first initialization transistor T4 among the plurality of transistors T1 to T7 may be n-channel MOSFETs (NMOS), and the rest may be p-channel MOSFETs (PMOS).

According to an embodiment of the inventive concept, the compensation transistor T3, the first initialization transistor T4, and the second initialization transistor T7 among the plurality of transistors T1 to T7 may be n-channel MOSFETs (NMOS), and the rest may be p-channel MOSFETs (PMOS). According to an embodiment of the inventive concept, only one of the plurality of transistors T1 to T7 may be an n-channel MOSFET (NMOS), and the rest may be p-channel MOSFETs (PMOS). According to an embodiment of the inventive concept, all of the plurality of transistors T1 to T7 may be n-channel MOSFETs (NMOS), or p-channel MOSFETs (PMOS).

The signal line may include a first current scan line SL1 for transmitting a first scan signal Sn, a second current scan line SL2 for transmitting a second scan signal Sn', a previous scan line SLp for transmitting a previous scan signal Sn−1 to the first initialization transistor T4, a light-emitting control line EL for transmitting a light-emitting control signal En to the operation control transistor T5 and the light-emitting control transistor T6, a next scan line SLn for transmitting a next scan signal Sn+1 to the second initialization transistor T7, and a data line DL for transmitting a data signal Dm, the data line DL crossing the first current scan line SL1.

The power voltage line PL may transmit a high power voltage ELVDD to the driving transistor T1, and the first initialization voltage line VL1 may transmit a first initialization voltage Vint1 for initializing the driving transistor T1. The gate of the driving transistor T1 may be connected to the storage capacitor Cst, the source of the driving transistor T1 may be connected to the power voltage line PL via the operation control transistor T5, and the drain of the driving transistor T1 may be electrically connected to the first electrode of the light-emitting element LD via the light-emitting control transistor T6. The driving transistor T1 may receive a data signal Dm in response to a switching operation of the switching transistor T2 and provide a driving current $I_{LD}$ to the light-emitting element LD.

The gate of the switching transistor T2 may be connected to the first current scan line SL1 for transmitting the first scan signal Sn, the source of the switching transistor T2 may be connected to the data line DL, and the drain of the switching transistor T2 is connected to the source of the driving transistor T1 and may also be connected to the power voltage line PL via the operation control transistor T5. The switching transistor T2 is turned on in response to the first scan signal Sn received through the first current scan line SL1, thus being able to perform a switching operation to transmit a data signal Dm, which is transmitted to the data line DL, to the source of the driving transistor T1.

The gate of the compensation transistor T3 is connected to the second current scan line SL2. The drain of the compensation transistor T3 is connected to the drain of the driving transistor T1 and may also be connected to the first electrode of the light-emitting element LD via the light-emitting control transistor T6. The source of the compensation transistor T3 may be connected to a first electrode CE10 of the storage capacitor Cst and the gate of the driving transistor T1. In addition, the source of the compensation transistor T3 may be connected to the drain of the first initialization transistor T4.

The compensation transistor T3 is turned on in response to the second scan signal Sn' received through the second current scan line SL2 so as to electrically connect the gate and drain of the driving transistor T1, thus being able to diode-connect the driving transistor T1.

The gate of the first initialization transistor T4 may be connected to the previous scan line SLp. The source of the first initialization transistor T4 may be connected to the first initialization voltage line VL1. The drain of the first initialization transistor T4 may be connected to the first electrode CE10 of the storage capacitor Cst, the source of the compensation transistor T3, and the gate of the driving transistor T1. The first initialization transistor T4 is turned on in response to the previous scan signal Sn−1 received through the previous scan line SLp so as to transmit the first initialization voltage Vint1 to the gate of the driving transistor T1, thus being able to perform an initialization operation for initializing the voltage of the gate of the driving transistor T1.

The gate of the operation control transistor T5 may be connected to the light-emitting control line EL, the operation control source of the operation control transistor T5 may be connected to the power voltage line PL, and the drain of the operation control transistor T5 may be connected to the source of the driving transistor T1 and the drain of the switching transistor T2.

The gate of the light-emitting control transistor T6 may be connected to the light-emitting control line EL, the light-emitting control source of the light-emitting control transistor T6 may be connected to the drain of the driving transistor T1 and the drain of the compensation transistor T3, and the drain of the light-emitting control transistor T6 may be electrically connected to the drain of the second initialization transistor T7 and the first electrode of the light-emitting element LD.

The operation control transistor T5 and the light-emitting control transistor T6 are simultaneously turned on in response to the light-emitting control signal En received through the light-emitting control line EL, so that the high power voltage ELVDD may be supplied to the light-emitting element LD and the driving current $I_{LD}$ may flow through the light-emitting element LD.

The gate of the second initialization transistor T7 may be connected to the next scan line SLn, the drain of the second initialization transistor T7 may be connected to the drain of the light-emitting control transistor T6 and the first electrode of the light-emitting element LD, and the source of the second initialization transistor T7 may be connected to the second initialization voltage line VL2 so as to receive the second initialization voltage Vint2. The second initialization transistor T7 is turned on in response to the next scan signal Sn+1 received through the next scan line SLn so as to initialize the first electrode of the light-emitting element LD.

In another embodiment of the inventive concept, the second initialization transistor T7 may be an n-channel MOSFETs (NMOS) and the gate of the second initialization transistor T7 may be connected to the light-emitting control line EL so as to be driven in response to the light-emitting control signal En. Meanwhile, the positions of a source and a drain may be changed with each other according to the types of transistors (p-type or n-type).

The storage capacitor Cst may include a first electrode CE10 and a second electrode CE20. The first electrode CE10 of the storage capacitor Cst is connected to the gate of the driving transistor T1, and the second electrode CE20 of the storage capacitor Cst is connected to the power voltage line PL. The storage capacitor Cst may store charge corresponding to a difference between the voltage of the gate of the driving transistor T1 and the high power voltage ELVDD.

A boosting capacitor Cbs may include a first electrode CE11 and a second electrode CE21. The first electrode CE11 of the boosting capacitor Cbs may be connected to the first electrode CE10 of the storage capacitor Cst, and the second electrode CE21 of the boosting capacitor Cbs may receive the first scan signal Sn. By increasing the voltage of the gate of the driving transistor T1 at the point when the supply of the first scan signal Sn is stopped, the boosting capacitor Cbs may compensate for the voltage drop of the above gate.

A detailed operation of each pixel PX according to an embodiment of the inventive concept is as follows.

During an initialization period, when the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and the second scan signal Sn' are provided through the first current scan line SL1 and the second current scan line SL2, the switching transistor T2 and the compensation transistor T3 are turned on in response to the first scan signal Sn and the second scan signal Sn'. In this case, the driving transistor T1 is diode-connected by the turned-on compensation transistor T3 and is biased in a forward direction.

Then, in the data signal Dm provided from the data line DL, a compensation voltage Dm+Vth (Vth is a negative value), which is reduced by the threshold voltage Vth of the driving transistor T1, is applied to the gate of the driving transistor T1.

The high power voltage ELVDD and the compensation voltage Dm+Vth are applied to both ends of the storage capacitor Cst, and a charge corresponding to a voltage difference between the both ends thereof is stored in the storage capacitor Cst.

During a light-emitting period, the operation control transistor T5 and the light-emitting control transistor T6 are turned on by the light-emitting control signal En provided from the light-emitting control line EL. A driving current $I_{LD}$ is generated according to a voltage difference between the voltage of the gate of the driving transistor T1 and the high power voltage ELVDD, and the driving current $I_{LD}$ is supplied to the light-emitting element LD through the light-emitting control transistor T6.

In this embodiment, at least one of the plurality of transistors T1 to T7 includes a semiconductor layer containing an oxide, and the other transistors include a semiconductor layer containing silicon. Specifically, the driving transistor T1, which directly affects the brightness of a display device, is configured to include a semiconductor layer composed of polycrystalline silicon having high reliability and, therefore, a high-resolution display device may be achieved through this configuration. Meanwhile, since an oxide semiconductor has a high carrier mobility and a low leakage current, a voltage drop is not great even when a driving time is long. That is, since a color change of an image due to the voltage drop is not great even during low-frequency driving, low-frequency driving is possible.

As described above, since the oxide semiconductor has an advantage that leakage current flows therethrough is small, it is possible not only to prevent leakage current from flowing through the first initialization transistor T4 and the compensation transistor T3 which are connected to the gate of the driving transistor T1, but also to reduce power consumption by adopting an oxide semiconductor in at least one of the compensation transistor T3 or the first initialization transistor T4 connected to the gate of the driving transistor T1. When the source of the second initialization transistor T7 is connected to the source of the first initialization transistor T4, the second initialization transistor T7 may also include an oxide semiconductor to prevent leakage current and reduce power consumption.

Figure 4:
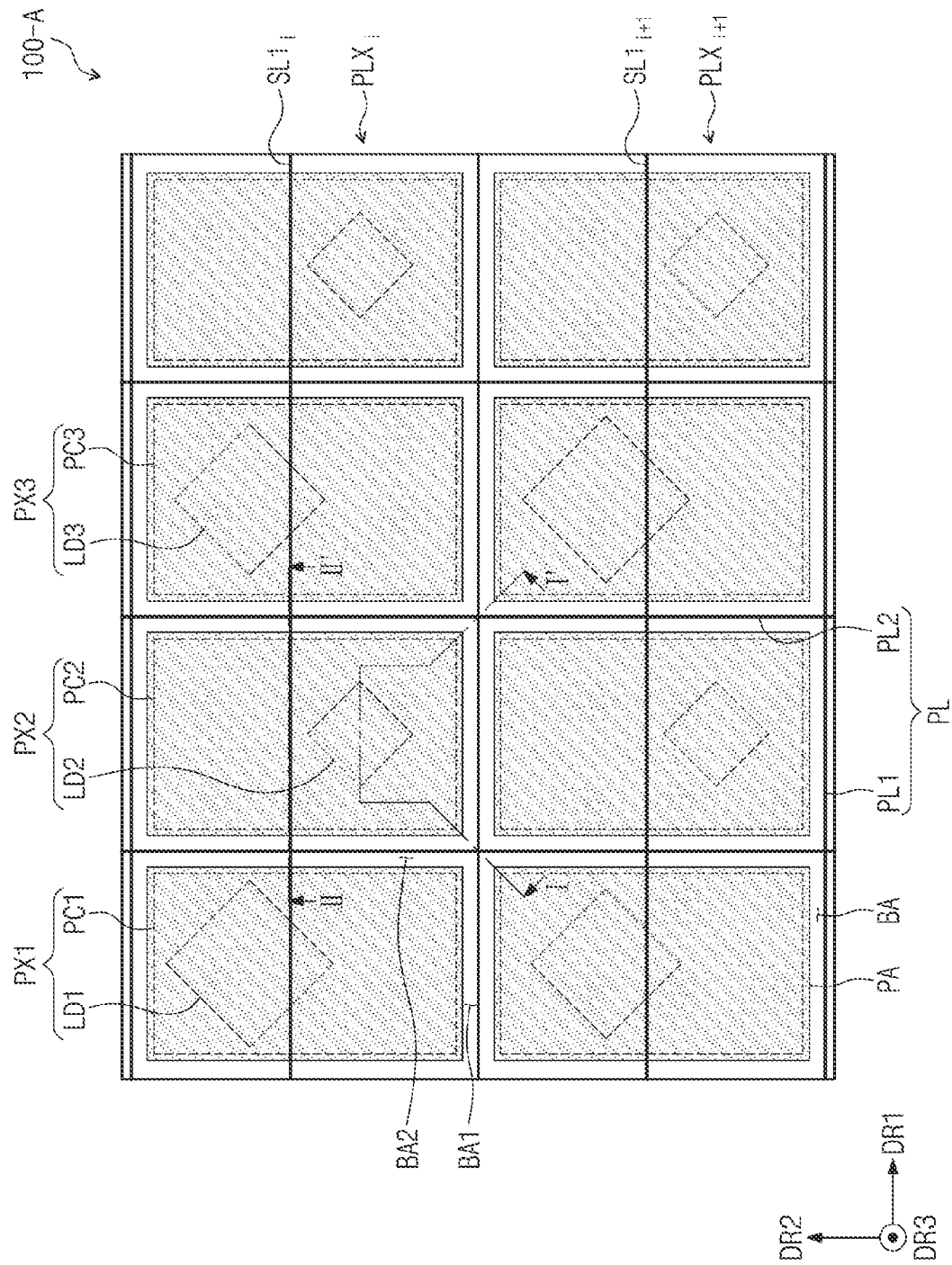
FIG. 4 is an enlarged plan view of the display panel according to an embodiment of the inventive concept.
Figure 5A:
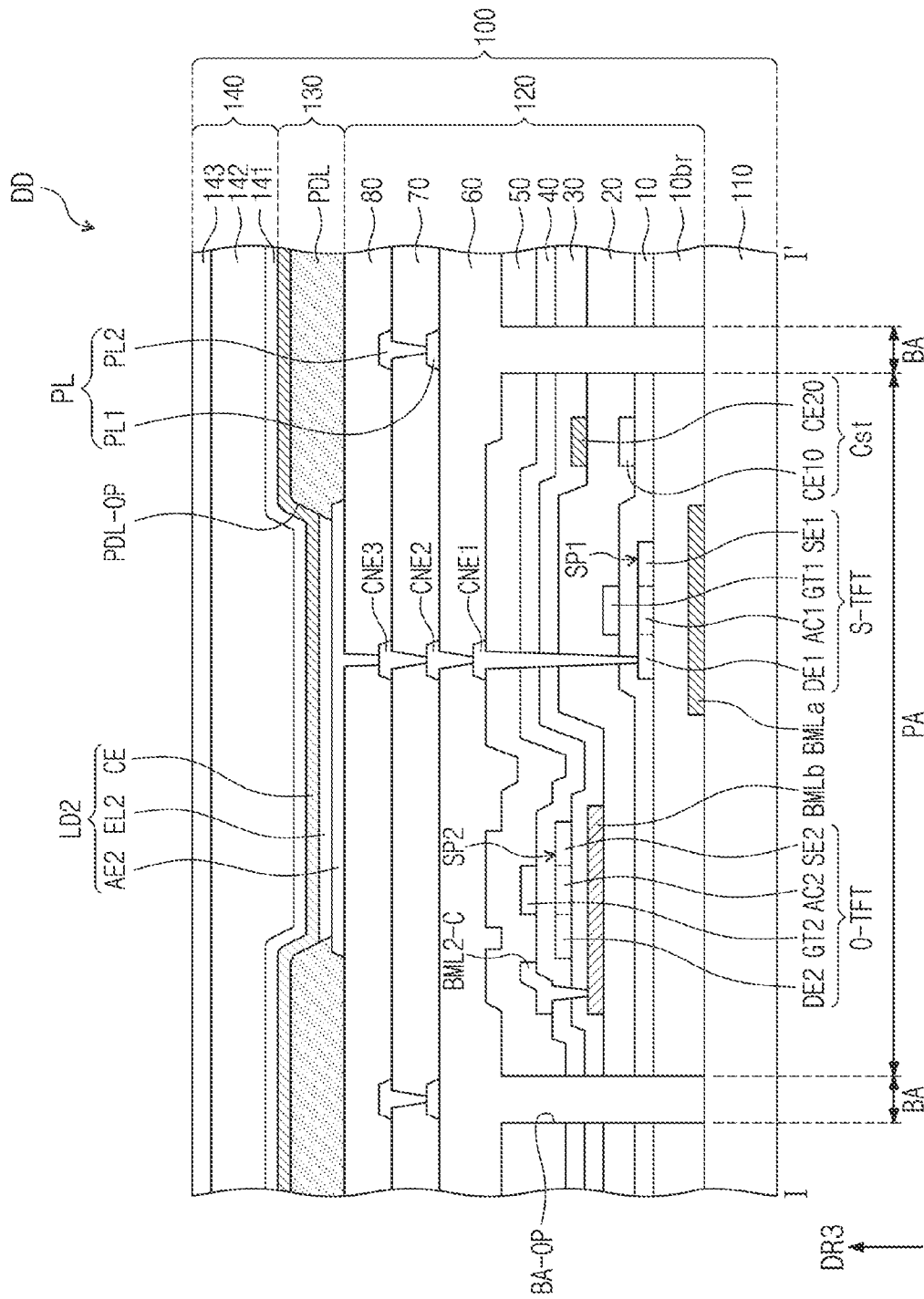
FIGS. 5A and 5B are cross-sectional views of display panels according to an embodiment of the inventive concept.
Figure 5B:
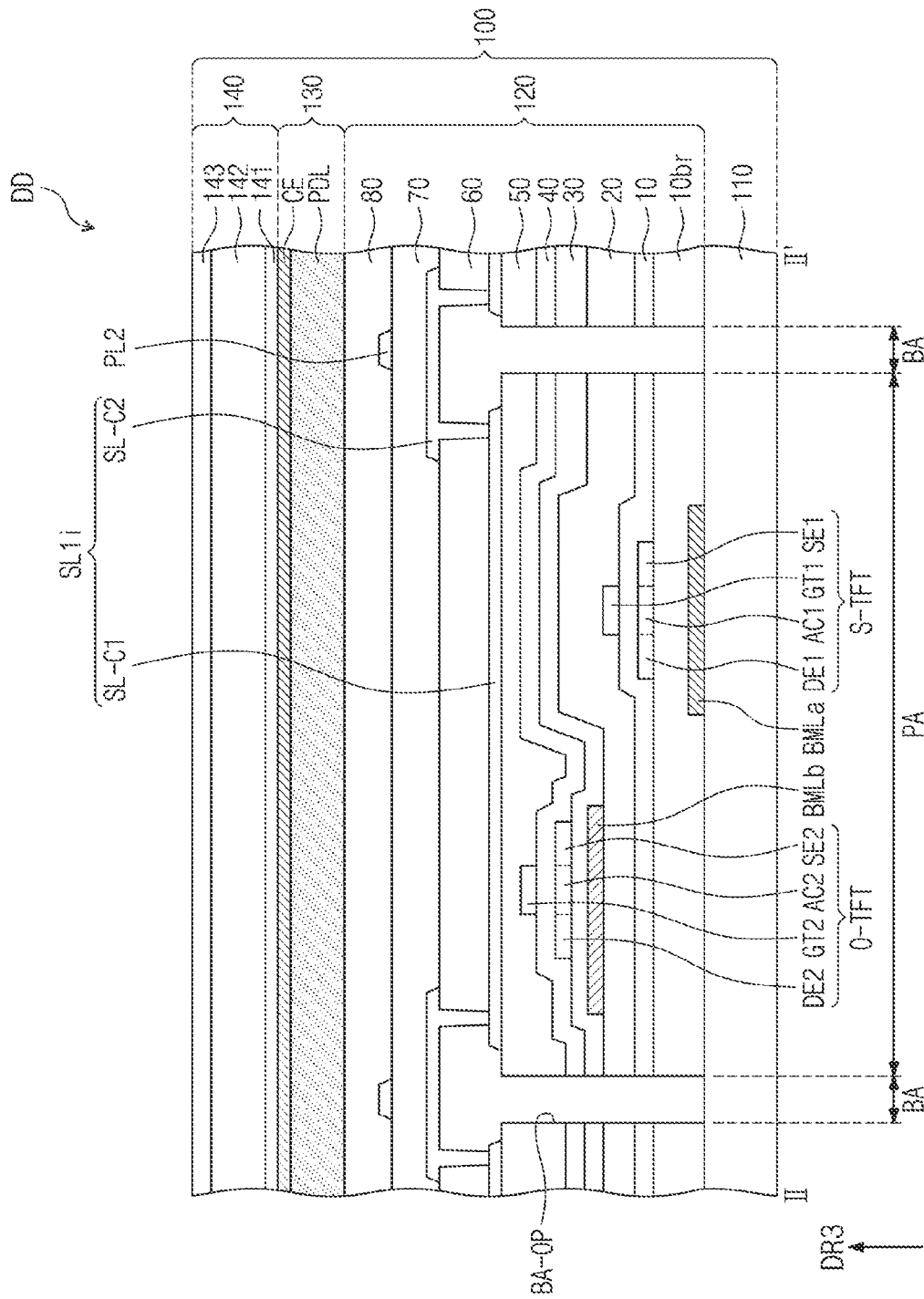
Figure 6A:
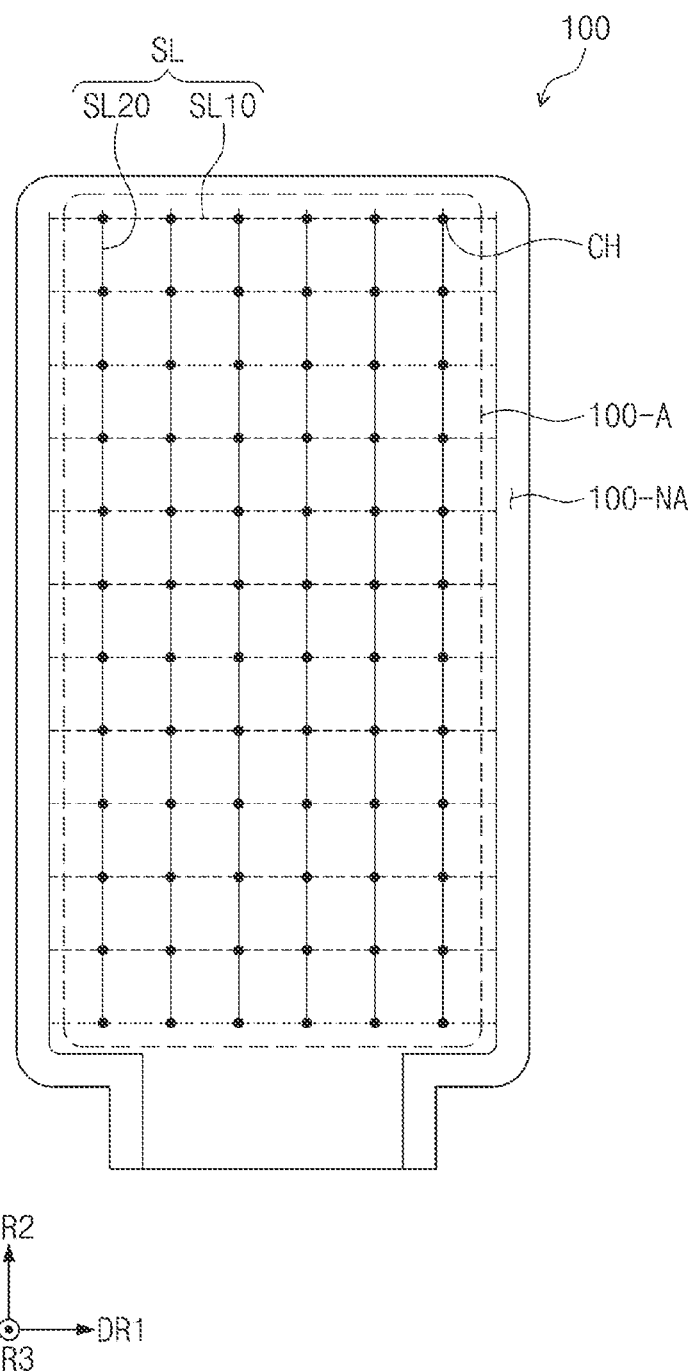
FIGS. 6A and 6B are plan views illustrating conductive lines according to an embodiment of the inventive concept.
Figure 6B:
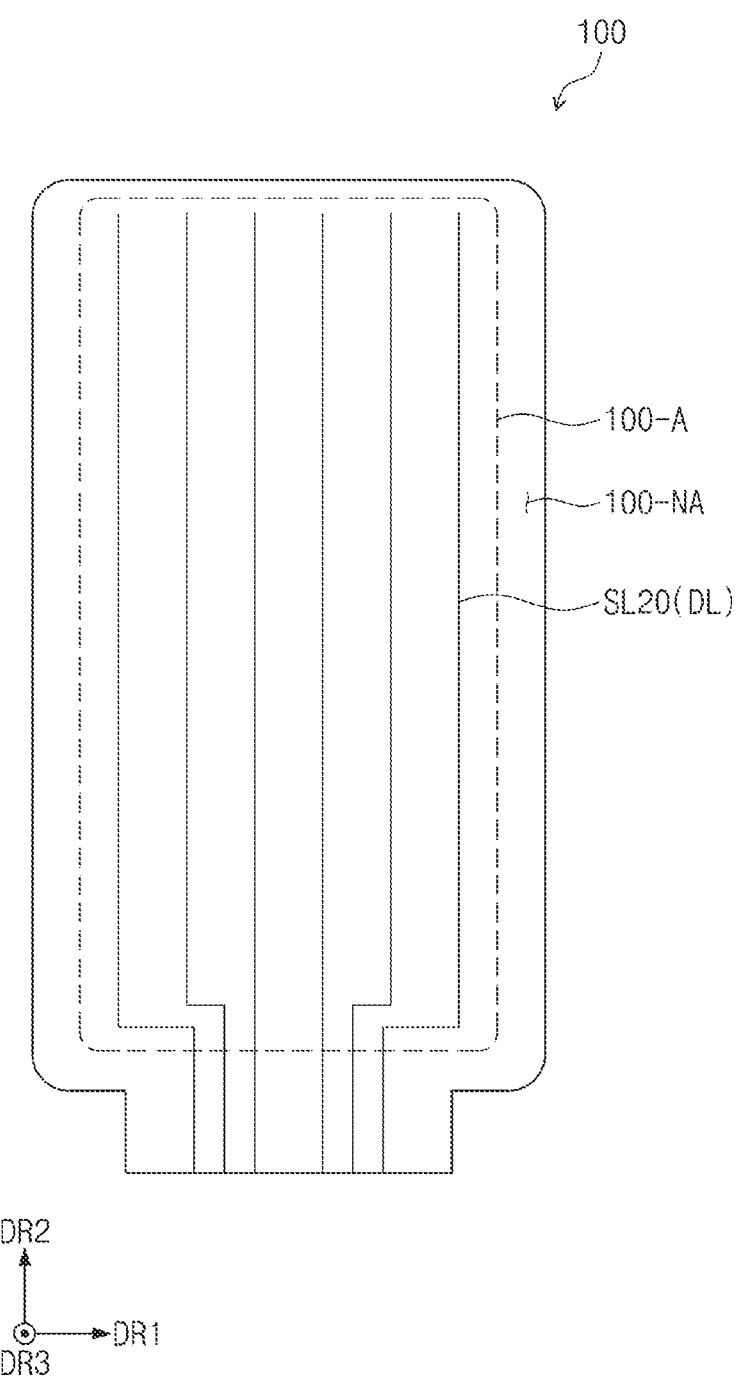

FIG. 4 is an enlarged plan view of the display panel 100 according to an embodiment of the inventive concept. FIGS. 5A and 5B are cross-sectional views of display panels 100 according to an embodiment of the inventive concept. FIGS. 6A and 6B are plan views illustrating conductive lines SL according to an embodiment of the inventive concept.

FIG. 4 is an enlarged view illustrating two pixel rows PXLi and PXLi+1. The i-th pixel row PXLi may include a first color pixel PX1, a second color pixel PX2, a third color pixel PX3, and a second color pixel PX2, which are arranged in the first direction DR1. The i+l-th pixel row PXLi+1 may include a third color pixel PX3, a second color pixel PX2, a first color pixel PX1, and a second color pixel PX2 which are arranged in the first direction DR1. Four color pixels in the pixel rows PXLi and PXLi+1 illustrated in FIG. 4 may be repeatedly disposed along the first direction DR. The color pixels of the pixel rows PXLi and PXLi+1 illustrated in FIG. 4 may be repeatedly disposed along the second direction DR2.

The display region 100-A may include a plurality of pixel regions PA and a boundary region BA disposed between the plurality of pixel regions PA. The boundary region BA may surround each of the plurality of pixel regions PA.

Pixel circuits PC1, PC2, and PC3 of the first color pixel PX1, the second color pixel PX2, and the third color pixel PX3 are respectively disposed in the plurality of pixel regions PA. Each of the pixel circuits PC1, PC2, and PC3 is the same as the pixel circuit PC described with reference to FIG. 3. Although each of the pixel circuits PC1, PC2, and PC3 is illustrated to be disposed in a region substantially correspond to a pixel region PA, the embodiment of the inventive concept is not limited thereto.

The pixel region PA is defined as a region other than the boundary region BA within the display region 100-A. The boundary region BA is a region defined by an opening BA-OP (refer to FIG. 5) which will be described later, and the display region 100-A which does not overlap the opening BA-OP (refer to FIG. 5) and is surrounded by the opening BA-OP corresponds to a pixel region PA. In this embodiment, although any one among the first color pixel PX1, the second color pixel PX2, and the third color pixel PX3 is illustrated to be disposed in each of the pixel regions PA, a plurality of color pixels may be arranged in one pixel region PA.

A first light-emitting element LD1, a second light-emitting element LD2, and a third light-emitting element LD3 are respectively disposed in the plurality of pixel regions PA. FIG. 4 illustrates anodes, which are marked with dotted lines having rhombic shape, in the first light-emitting element LD1, the second light-emitting element LD2, and the third light-emitting element LD3.

FIG. 4 illustrates a first current scan line SL1$i$ of the i-th pixel row PXLi and a first current scan line SL1$i$+1 of the i+1-th pixel row PXLi+1 as representing the scan lines SLL, SL2, SLp, and SLn (refer to FIG. 3). FIG. 4 does not illustrate the light-emitting control line EL, the data line DL, the first initialization voltage line VL1, and the second initialization voltage line VL2, which are illustrated in FIG. 3.

FIG. 4 illustrates a power voltage line PL. The power voltage line PL may receive the high power voltage ELVDD or the low power voltage ELVSS described with reference to FIG. 3.

The power voltage line PL may include a first power line PL1 extending in the first direction DR1 and a second power line PL2 extending in the second direction DR2. The power voltage line PL may include only one of the first power line PL1 and the second power line PL2.

The power voltage line PL overlaps the boundary region BA. The power voltage line PL extends substantially in the same direction as the boundary region BA. The boundary region BA may include a first region BA1 extending in the first direction DR1 and a second region BA2 extending in the second direction DR2. The first power line PL1 extends in the first direction DR1 in the first region BA1. The second power line PL2 extends in the second direction DR2 in the second region BA2. The crossing region of the first power line PL1 and the second power line PL2 overlaps the crossing region of the first region BA1 and the second region BA2.

FIG. 5A illustrates the second light-emitting element LD2, and a silicon transistor S-TFT and an oxide transistor O-TFT of the second pixel circuit PC2 (refer to FIG. 4). In the equivalent circuit illustrated in FIG. 3, the third and fourth transistors T3 and T4 may be oxide transistors O-TFT and the remaining transistors may be silicon transistors S-TFT. In an embodiment of the inventive concept, the pixel circuit may include only one type of transistor among a silicon transistor S-TFT and an oxide transistor O-TFT.

A buffer layer 10$br$ may be disposed on the base layer 110. The buffer layer 10$br$ may prevent metal atoms or impurities from diffusing from the base layer 110 to a first semiconductor pattern SP1 disposed above. The first semiconductor pattern SP1 includes the active region AC1 of the silicon transistor S-TFT. The buffer layer 10$br$ may adjust a heat conductivity during a crystallization process for forming the first semiconductor pattern SP1 so that the first semiconductor pattern SP1 may be uniformly formed. The buffer layer 10$br$ may include at least one inorganic layer. The buffer layer 10$br$ including an inorganic layer may be referred to as an inorganic buffer layer. The buffer layer 10br may include a silicon oxide layer and a silicon nitride layer.

A first rear-surface metal layer BMLa may be disposed under the silicon transistor S-TFT, and a second rear-surface metal layer BMLb may be disposed under the oxide transistor O-TFT. The first and second rear-surface metal layers BMLa and BMLb may overlap the first to third pixel circuits PC1, PC2, and PC3 (refer to FIG. 4). The first and second rear-surface metal layers BMLa and BMLb may block external light from reaching the first to third pixel circuits PC1, PC2, and PC3.

The first rear-surface metal layer BMLa may be disposed to correspond to at least a partial region of each of the first to third pixel circuits PC1, PC2, and PC3 (refer to FIG. 4). The first rear-surface metal layer BMLa may be disposed to overlap the driving transistor T1 (refer to FIG. 3) which is implemented as a silicon transistor S-TFT.

The first rear-surface metal layer BMLa may be disposed between the base layer 110 and the buffer layer 10br. In an embodiment of the inventive concept, an inorganic barrier layer may be further disposed between the first rear-surface metal layer BMLa and the buffer layer 10br. The first rear-surface metal layer BMLa may be connected to an electrode or line and receive a constant voltage or a signal therefrom. According to an embodiment of the inventive concept, the first rear-surface metal layer BMLa may be a floating electrode isolated from another electrode or line.

The second rear-surface metal layer BMLb may be disposed to correspond to the lower portion of the oxide transistor O-TFT. The second rear-surface metal layer BMLb may be disposed between a second insulating layer 20 and a third insulating layer 30. The second rear-surface metal layer BMLb may be disposed in the same layer as the second electrode CE20 of the storage capacitor Cst. The second rear-surface metal layer BMLb may be connected to a contact electrode BML2-C so as to receive a constant voltage or a signal. The contact electrode BML2-C may be disposed in the same layer as the gate GT2 of the oxide transistor O-TFT.

Each of the first rear-surface metal layer BMLa and the second rear-surface metal layer BMLb may contain a reflective metal. For example, each of the first rear-surface metal layer BMLa and the second rear-surface metal layer BMLb may contain at least one of silver (Ag), an alloy containing silver (Ag), molybdenum (Mo), an alloy containing molybdenum, aluminum (Al), an alloy containing aluminum, aluminum nitride (AlN), tungsten (W), tungsten nitride (WN), copper (Cu), p+-doped amorphous silicon, or the like. The first rear-surface metal layer BMLa and the second rear-surface metal layer BMLb may contain a same material or materials different from each other.

Although not illustrated separately, according to an embodiment of the inventive concept, the second rear-surface metal layer BMLb may be omitted. The first rear-surface metal layer BMLa may extend under the oxide transistor O-TFT so that the first rear-surface metal layer BMLa may block light incident from the base layer 110 side onto the oxide transistor O-TFT.

The first semiconductor pattern SP1 may be disposed on the buffer layer 10br. The first semiconductor pattern SP1 may include a silicon semiconductor. For example, the silicon semiconductor may contain amorphous silicon, polycrystalline silicon, and the like. For example, the first semiconductor pattern SP1 may contain low-temperature polysilicon.

FIG. 5A illustrates only a portion of the first semiconductor pattern SP1 disposed on the buffer layer 10br. The first semiconductor pattern SP1 may be further disposed in a portion other than the portion shown in FIG. 5A. The first semiconductor pattern SP1 may be arranged in predetermined portions over the pixel region PA (refer to FIG. 4). The first semiconductor pattern SP1 may have different electrical properties depending on whether or not it is doped. The first semiconductor pattern SP1 may include a first region having high conductivity and a second region having low conductivity. The first region may be doped with an n-type dopant or a p-type dopant. A p-type transistor may include doped regions doped with a p-type dopant and an n-type transistor may include doped regions doped with an n-type dopant. The second region may be a non-doped region or a region doped at a lower concentration than the first region.

The conductivity of the first region may be greater than that of the second region and the first region may substantially function as an electrode or a signal line. The second region may substantially correspond to an active region (or channel) of a transistor. In other words, a portion of the first semiconductor pattern SP1 may be an active region of a transistor, another portion thereof may be a source or drain of a transistor, and still another portion thereof may be a connection electrode or a connection signal line.

A source region SE1 (or a source), an active region AC1 (or a channel), and a drain region DE1 (or a drain) of the silicon transistor S-TFT may be formed from the first semiconductor pattern SP1. The source region SE1 and the drain region DE1 may extend in directions opposite to each other from the active region AC1 on a cross-sectional view.

A first insulating layer 10 may be disposed on the buffer layer 10br. The first insulating layer 10 may overlap the plurality of pixels PX1, PX2, and PX3 (refer to FIG. 4) in common and cover the first semiconductor pattern SP1. The first insulating layer 10 may be an inorganic layer and have a single-layered or multi-layered structure. The first insulating layer 10 may contain at least one of an aluminum oxide, a titanium oxide, a silicon oxide, a silicon nitride, a silicon oxynitride, a zirconium oxide, or a hafnium oxide. In this embodiment, the first insulating layer 10 may be a single-layered silicon oxide layer. The inorganic layer of the circuit layer 120 to be described later as well as the first insulating layer 10 may have a single-layered or multi-layered structure and include at least one of the above-described materials, but the embodiment of the inventive concept is not limited thereto.

The gate GT1 of the silicon transistor S-TFT is disposed on the first insulating layer 10. The gate GT1 thereof may be a portion of a metal pattern. The gate GT1 overlaps the active region ACL. In the process of doping the first semiconductor pattern SP1, the gate GT1 may function as a self-aligned mask. The gate GT1 may contain at least one of titanium (Ti), silver (Ag), an alloy containing silver, molybdenum (Mo), an alloy containing molybdenum, aluminum (Al), an alloy containing aluminum, an aluminum nitride (AlN), tungsten (W), an tungsten nitride (WN), copper (Cu), an indium tin oxide (ITO), an indium zinc oxide (IZO), or the like, but the embodiment of the inventive concept is not particularly limited thereto.

The second insulating layer 20 may be disposed on the first insulating layer 10 and cover the gate GT1. The third insulating layer 30 may be disposed on the second insulating layer 20. The second electrode CE20 of the storage capacitor Cst and the second rear-surface metal layer BMLb may be disposed between the second insulating layer 20 and the third insulating layer 30. In addition, the first electrode CE10 of the storage capacitor Cst may be disposed between the first insulating layer 10 and the second insulating layer 20. The second insulating layer 20 and the third insulating layer 30 may be inorganic layers.

The second semiconductor pattern SP2 may be disposed on the third insulating layer 30. The second semiconductor pattern SP2 may include the active region AC2 of the oxide transistor O-TFT. The second semiconductor pattern SP2 may include an oxide semiconductor. The second semiconductor pattern SP2 may contain a transparent conductive oxide (TCO) such as an indium tin oxide (ITO), an indium zinc oxide (IZO), an indium gallium zinc oxide (IGZO), a zinc oxide (ZnO), or an indium oxide ($In_2O_3$).

The oxide semiconductor may include a plurality of regions which include a reduced region in which the transparent conductive oxide has been reduced and a non-reduced region in which the transparent conductive oxide has not been reduced. A region in which the transparent conductive oxide has been reduced (hereinafter, a reduced region) has greater conductivity than a region in which the transparent conductive oxide has not been reduced (hereinafter, a non-reduced region). The reduced region substantially functions as a source/drain of a transistor or a signal line. The non-reduced region substantially corresponds to a semiconductor region (or an active region or channel) of a transistor. In other words, a portion of the second semiconductor pattern SP2 may be a semiconductor region of a transistor, other portions thereof may be a source region and a drain region of a transistor, and still the other portion thereof may be a signal transmission region.

A source region SE2 (or a source), an active region AC2 (or a channel), and a drain region DE2 (or a drain) of the oxide transistor O-TFT may be formed from the second semiconductor pattern SP2. The source region SE2 and the drain region DE2 may extend in directions opposite to each other from the active region AC2 in a cross-sectional view.

A fourth insulating layer 40 may be disposed on the third insulating layer 30. The fourth insulating layer 40 may cover the second semiconductor pattern SP2. As illustrated in FIG. 5A, the gate GT2 of the oxide transistor O-TFT is disposed on the fourth insulating layer 40. The gate GT2 of the oxide transistor O-TFT may be a portion of a metal pattern. The gate GT2 of the oxide transistor O-TFT overlaps the active region AC2.

A fifth insulating layer 50 may be disposed on the fourth insulating layer 40 and cover the gate GT2. A first connection electrode CNE1 may be disposed on the fifth insulating layer 50. The fourth insulating layer 40 and the fifth insulating layer 50 may be inorganic layers. The first connection electrode CNE1 may be connected to the drain region DE1 of the silicon transistor S-TFT through a contact hole formed through the first to fifth insulating layers 10, 20, 30, 40, and 50.

The buffer layer 10br and the first to fifth insulating layers 10, 20, 30, 40, and 50 may form a stack structure of insulating layers. In this embodiment, the stack structure of insulating layers is described as a stack structure of inorganic layers, but some of the insulating layers of the stack structure may be organic layers.

An opening BA-OP is defined in the stack structure of the inorganic layers in areas corresponding to the boundary region BA described with reference to FIG. 4. Although not illustrated separately, the opening BA-OP may include a first opening region corresponding to the first region BA1 and a second opening region corresponding to the second region BA2.

The stack structure of the inorganic layers is divided into a plurality of islands corresponding to the plurality of pixels PX1 PX2 and PX3 illustrated in FIG. 4. Stress generated by an external impact is concentrated on the opening BA-OP, and stress applied to the stacked structures of the inorganic layers divided into islands may be reduced. A crack due to an external impact in one of the stack structure of the inorganic layers may be prevented from being propagated by the opening BA-OP. This is because a crack formed in any of a plurality of island structures may not propagated into adjacent island structures because of the opening BA-OP.

A sixth insulating layer 60 may be disposed on the fifth insulating layer 50. The sixth insulating layer 60 is configured to fill the opening BA-OP. The sixth insulating layer 60 may remove a step difference formed in the inorganic layers thereunder and provide a flat top surface.

A second connection electrode CNE2 may be disposed on the sixth insulating layer 60. The second connection electrode CNE2 may be connected to the first connection electrode CNE1 through a contact hole formed through the sixth insulating layer 60. A first power line PL1 overlapping the opening BA-OP is disposed on the sixth insulating layer 60 and is formed at the same time with the second connection electrode CNE2.

A seventh insulating layer 70 may be disposed on the sixth insulating layer 60 and cover the second connection electrode CNE2. A third connection electrode CNE3 may be disposed on the seventh insulating layer 70. The third connection electrode CNE3 may be connected to the second connection electrode CNE2 through a contact hole formed through the seventh insulating layer 70. A second power line PL2 overlapping the opening BA-OP is disposed on the seventh insulating layer 70. The second power line PL2 may be connected to the first power line PL1 through a contact hole formed through the seventh insulating layer 70. The third connection electrode CNE3 and the second power line PL2 may be formed at the same time with the second connection electrode CNE2. An eighth insulating layer 80 may be disposed on the seventh insulating layer 70.

In this embodiment, each of the sixth insulating layer 60, the seventh insulating layer 70, and the eighth insulating layer 80 may be an organic layer. The sixth insulating layer 60 may be defined as a first organic layer, the seventh insulating layer 70 may be defined as a second organic layer, and the eighth insulating layer 80 may be defined as a third organic layer.

Each of the sixth insulating layer 60, the seventh insulating layer 70, and the eighth insulating layer 80 may include a general-purpose polymer such as benzocyclobutene (BCB), polyimide, hexamethyldisiloxane (HMDSO), polymethylmethacrylate (PMMA), or polystyrene (PS), a polymer derivative having a phenol-based group, an acrylic-based polymer, an imide-based polymer, an aryl ether-based polymer, an amide-based polymer, fluorine-based polymer, a p-xylene-based polymer, a vinyl alcohol-based polymer, or blends thereof.

The second light-emitting element LD2 may include a first electrode AE2 (or a pixel electrode), a light-emitting layer EL2, and a second electrode CE (or a common electrode). The second electrode of the first light-emitting element LD1 and the third light-emitting element LD3 described with reference to FIG. 4 may have an integral shape with the second electrode CE of the second light-emitting element LD2. That is, the second electrode CE may be provided in common to the first light-emitting element LD1, the second light-emitting element LD2, and the third light-emitting element LD3.

The first electrode AE2 may be disposed on the eighth insulating layer 80. The first electrode AE2 may be a transparent electrode, a semi-transparent electrode, or a reflective electrode. According to an embodiment of the inventive concept, the first electrode AE2 may include a reflective layer formed of Ag, Mg, Al, Pt, Pd, Au, Ni, Nd, Ir, Cr, or compounds thereof, and a transparent or semi-transparent electrode layer formed on the reflective layer. The transparent or semi-transparent electrode layer may contain at least one selected from a group consisting of an indium tin oxide (ITO), an indium zinc oxide (IZO), an indium gallium zinc oxide (IGZO), a zinc oxide (ZnO) or an indium oxide ($In_2O_3$), and an aluminum-doped zinc oxide (AZO). For example, the first electrode AE2 may include a stack structure of ITO/Ag/ITO.

A pixel defining layer PDL may be disposed on the eighth insulating layer 80. The pixel defining layer PDL may have transparent properties or light-absorbing properties. For example, the pixel defining layer PDL that absorbs light may contain a black coloring agent. The black coloring agent may include a black dye and a black pigment. The black coloring agent may include carbon black, a metal such as chromium, or an oxide thereof. The pixel defining layer PDL may correspond to a light-blocking pattern having light-blocking characteristics.

The pixel defining layer PDL may cover a portion of the first electrode AE2. For example, an opening PDL-OP exposing a portion of the first electrode AE2 may be defined in the pixel defining layer PDL. The pixel defining layer PDL may increase the distance between an edge of the first electrode AE2 and the second electrode CE. Accordingly, the pixel defining layer PDL may function to prevent an arc or the like from occurring at the edges of the first electrode AE2.

Although not illustrated, a hole control layer may be disposed between the first electrode AE2 and the light-emitting layer EL2. The hole control layer may include a hole transport layer. The hole control layer may further include a hole injection layer. An electron control layer may be disposed between the light-emitting layer EL2 and the second electrode CE. The electron control layer may include an electron transport layer. The electron control layer may further include an electron injection layer. The hole control layer and the electron control layer may be formed in common in the plurality of pixels PX1 PX2 and PX3 (refer to FIG. 4) by using an open mask.

An encapsulation layer 140 may be disposed on the light-emitting element layer 130. The encapsulation layer 140 may include an inorganic layer 141, an organic layer 142, and an inorganic layer 143 that are sequentially stacked, but the layers constituting the encapsulation layer 140 are not limited thereto.

The inorganic layers 141 and 143 may protect the light-emitting element layer 130 from moisture and oxygen and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acryl-based organic layer, but the embodiment of the inventive concept is not limited thereto.

FIG. 5B illustrates a silicon transistor S-TFT and an oxide transistor O-TFT which are distinguished from the silicon transistor S-TFT and the oxide transistor O-TFT illustrated in FIG. 5A with regard to the second pixel circuit PC2 (refer to FIG. 4). The second pixel circuit PC2 may include a first current scan line SL1$i$ disposed on the fifth insulating layer 50. The first current scan line SL1$i$ may include a first conductive pattern SL-C1 disposed on the fifth insulating layer 50 in each of the pixel region PA. The first conductive pattern SL-C1 may be an isolated pattern which is formed in a region corresponding to each pixel region PA. The first current scan line SL1$i$ may further include a second conductive pattern SL-C2 disposed on the sixth insulating layer 60. The second conductive pattern SL-C2 may connect the first conductive patterns SL-C1 disposed adjacent each other. The conductive pattern SL-C2 may cross the boundary region BA.

The second conductive pattern SL-C2 is disposed on a layer different from that of the second power line PL2 so that a short circuit with the second power line PL2 does not occur. In an embodiment of the inventive concept, the first conductive pattern SL-C1 may not be disposed on the fifth insulating layer 70 but may be disposed on the seventh insulating layer 70.

Referring to FIG. 6A, the conductive line SL may include a plurality of first lines SL10 extending in the first direction DR1 and a plurality of second lines SL20 extending in the second direction DR2. The first line SL10 and the second line SL20 may respectively correspond to the first power line PL1 and the second power line PL2 illustrated in FIGS. 4 to 5B, but the embodiment of the inventive concept is not limited thereto. The first line SL10 overlaps the first region BA1 illustrated in FIG. 4 and the second line SL20 overlaps the second region BA2 illustrated in FIG. 4. When any one among the first line SL10 and the second line SL20 is disposed in the same layer as any one among the first to third connection electrodes CNE1, CNE2, and CNE3 illustrated in FIG. 5A, the other one among the first line SL10 and the second line SL20 may be disposed in the same layer as another one among the first to third connection electrodes CNE1, CNE2, and CNE3 illustrated in FIG. 5A.

A first initialization voltage line VL1 or a second initialization voltage line VL2 may be implemented in the same shape as the conductive line SL illustrated in FIG. 6A. A voltage line providing the low power voltage ELVSS to the light-emitting element LD illustrated in FIG. 3 may also be implemented in the same shape as the conductive line SL illustrated in FIG. 6A. That is, each of the first initialization voltage line VL1, the second initialization voltage line VL2, and the voltage line may has a line corresponding to the first line SL10 and a line corresponding to the second line SL20.

As illustrated in FIG. 6B, the second line SL20 may include a data line DL. The data line DL may be disposed for each pixel column. The data line DL overlaps the second region BA2 illustrated in FIG. 4.

Figure 7A:
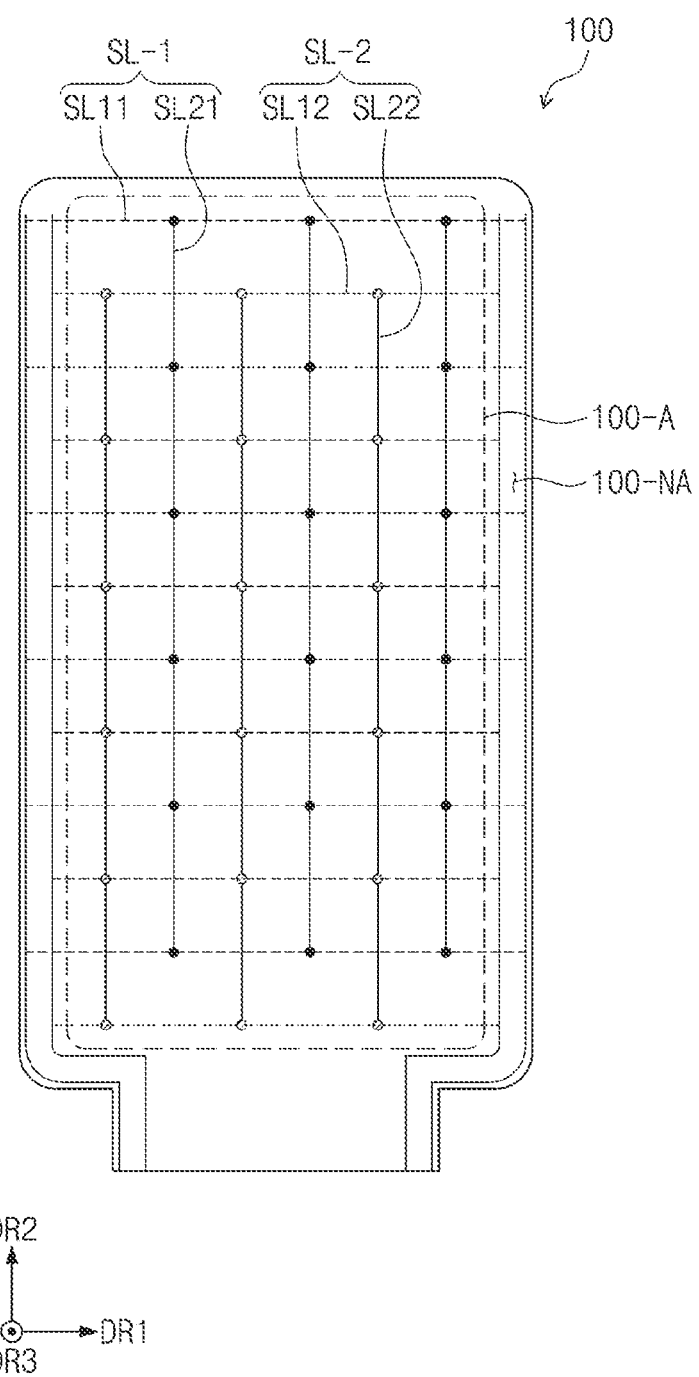
FIGS. 7A and 7B are plan views illustrating conductive lines according to an embodiment of the inventive concept.
Figure 7B:
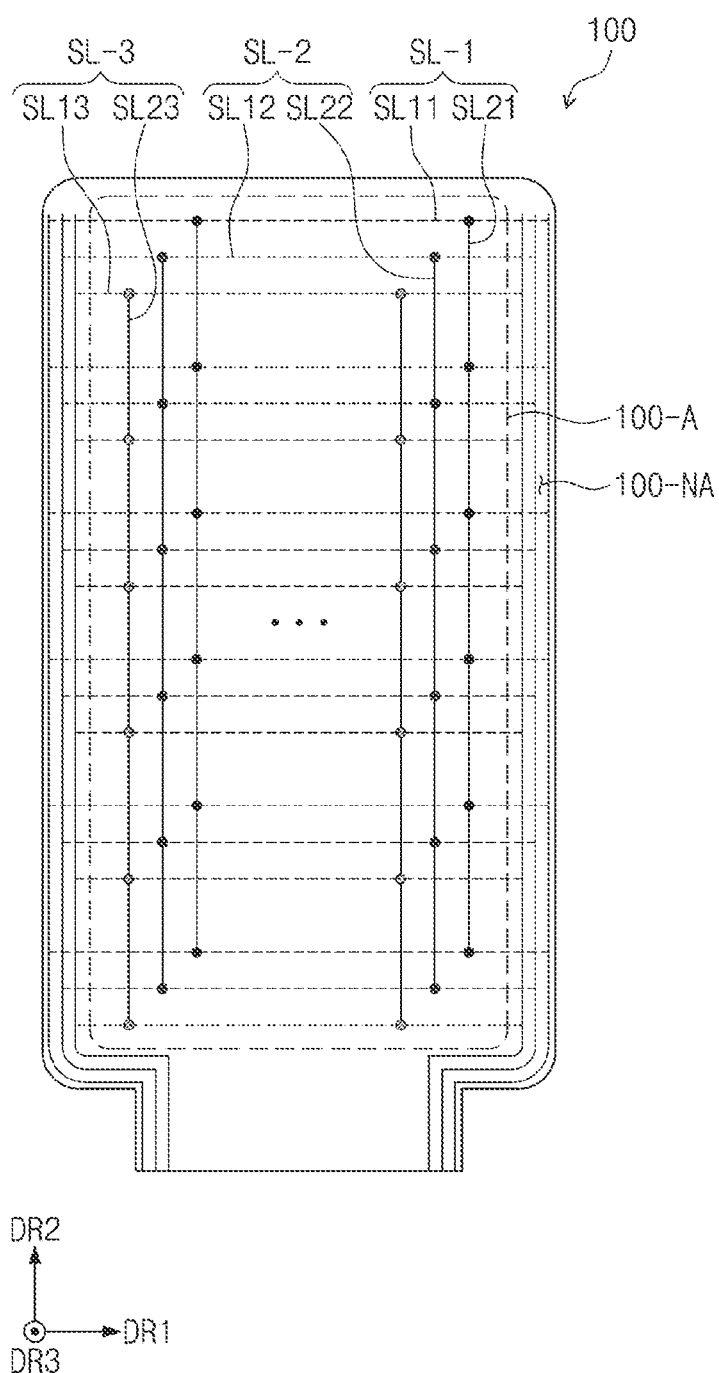

FIGS. 7A and 7B are plan views illustrating conductive lines SL-1, SL-2, and SL-3 according to an embodiment of the inventive concept. A detailed description of the same configuration as that described with reference to FIGS. 1 to 6B will be omitted.

The display panel 100 may include two types of conductive lines SL-1 and SL-2 as illustrated in FIG. 7A or three types of conductive lines SL-1, SL-2, and SL-3 as illustrated in FIG. 7B.

A first line SL11 of the first-type conductive line SL-1 may be disposed in a portion of the first region BA1 (refer to FIG. 4) of the display panel 100, and a first line SL12 of the second-type conductive line SL-2 may be disposed in another portion of the first region BAL. A second line SL21 of the first-type conductive line SL-1 may be disposed in a portion of the second region BA2 (refer to FIG. 4) of the display panel 100, and a second line SL22 of the second-type conductive line SL-2 may be disposed in another portion of the second region BA2.

When the first-type conductive line SL-1 is any one among a power line for receiving a high power voltage ELVDD or a low power supply voltage ELVSS, the first initialization voltage line VL1, and the second initialization voltage line VL2, the second-type conductive line SL-2 may be conductive lines other than the power line, the first initialization voltage line VL1, and the second initialization voltage line VL2.

In one embodiment of the inventive concept, the first line SL11 of the first-type conductive line SL-1 or the first line SL12 of the second-type conductive line SL-2 may include a first conductive pattern SL-C1 and a second conductive pattern SL-C2 like the first current scan line SL1i illustrated in FIG. 5B.

As illustrated in FIG. 7B, the three types of conductive lines SL-1, SL-2, and SL-3 may be disposed so as not to be short-circuited one another in respective first regions BA1 (refer to FIG. 4) and second regions BA2 (refer to FIG. 4).

Figure 8:
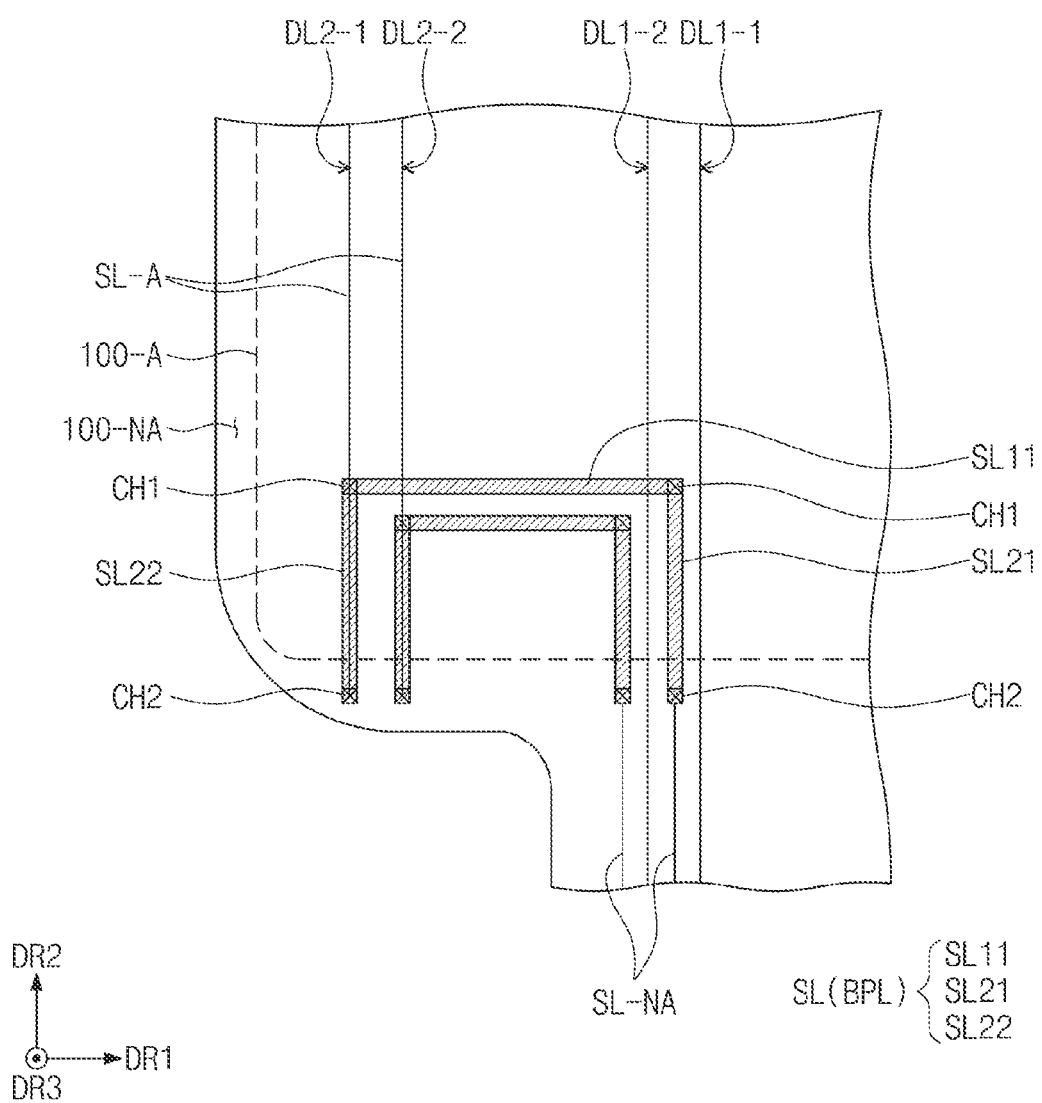
FIG. 8 is an enlarged plan view of a display panel according to an embodiment of the inventive concept.

FIG. 8 is an enlarged plan view of a display panel 100 according to an embodiment of the inventive concept.

Referring to FIG. 8, the conductive line SL may include a bypass line BPL and constitute a portion of the data line. The bypass line BPL may substitute for a signal line which is disposed in the non-display region 100-NA. Accordingly, the area of the non-display region 100-NA may be reduced.

FIG. 8 illustrates two groups of data lines DL1-1, DL1-2, DL2-1, and DL2-2 connected to the data driving circuit DDC (refer to FIG. 1). The data lines DL1-1 and DL1-2 of the first group may have an integral shape, and the data lines DL2-1 and DL2-2 of the second group may include a bypass line BPL which includes a plurality of portions.

The bypass line BPL may include a horizontal line SL1l (or a first line) extending in the first direction DR1 and a first vertical line SL21 (or one second line) and a second vertical line SL22 (or the other second line) which extend in the second direction DR2. The horizontal line SL11 corresponds to the first power line PL1 illustrated in FIG. 4 or the first line SL10 of FIG. 6A, and each of the first vertical line SL21 and the second vertical line SL22 corresponds to the second power line PL2 illustrated in FIG. 4 or the second line SL20 of FIG. 6A. The horizontal line SL1l may be disposed in a layer different from those of the first and second vertical lines SL21 and SL22.

The bypass line BPL may be connected to each of a third line SL-NA disposed in the non-display region 100-NA and a fourth line SL-A disposed in the display region 100-A. The horizontal line SL11 is connected to each of the first vertical line SL21 and the second vertical line SL22 through a first contact hole CH1. The first vertical line SL21 is connected to the third line SL-NA through a second contact hole CH2. The second vertical line SL22 is connected to the fourth line SL-A through the second contact hole CH2.

The horizontal line SL11, the first and second vertical lines SL21 and SL22, and the third and fourth lines SL-NA and SL-A may be disposed in different layers. When any one among the horizontal line SL11, the first and second vertical lines SL21 and SL22, and the third and fourth lines SL-NA and SL-A is disposed in the same layer as the first connection electrode CNE1 illustrated in FIG. 5A, another one among the horizontal line SL11, the first and second vertical lines SL21 and SL22, and the third and fourth lines SL-NA and SL-A may be disposed in the same layer as the second connection electrode CNE2 illustrated in FIG. 5A. The other one among the horizontal line SL11, the first and second vertical lines SL21 and SL22, and the third and fourth lines SL-NA and SL-A may be disposed in the same layer as the third connection electrode CNE3.

Figure 9A:
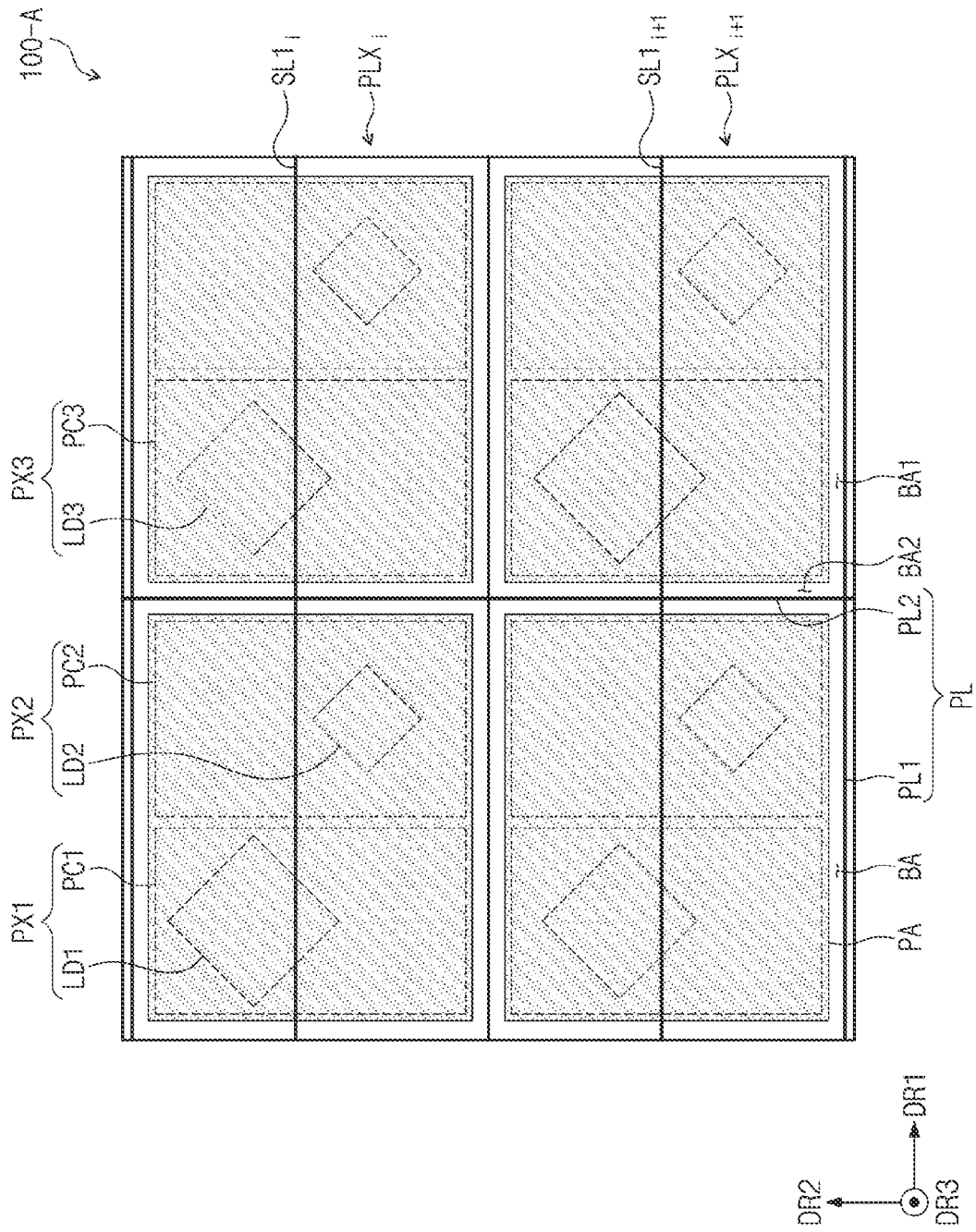
FIGS. 9A and 9B are enlarged plan views of a display region according to an embodiment of the inventive concept.
Figure 9B:
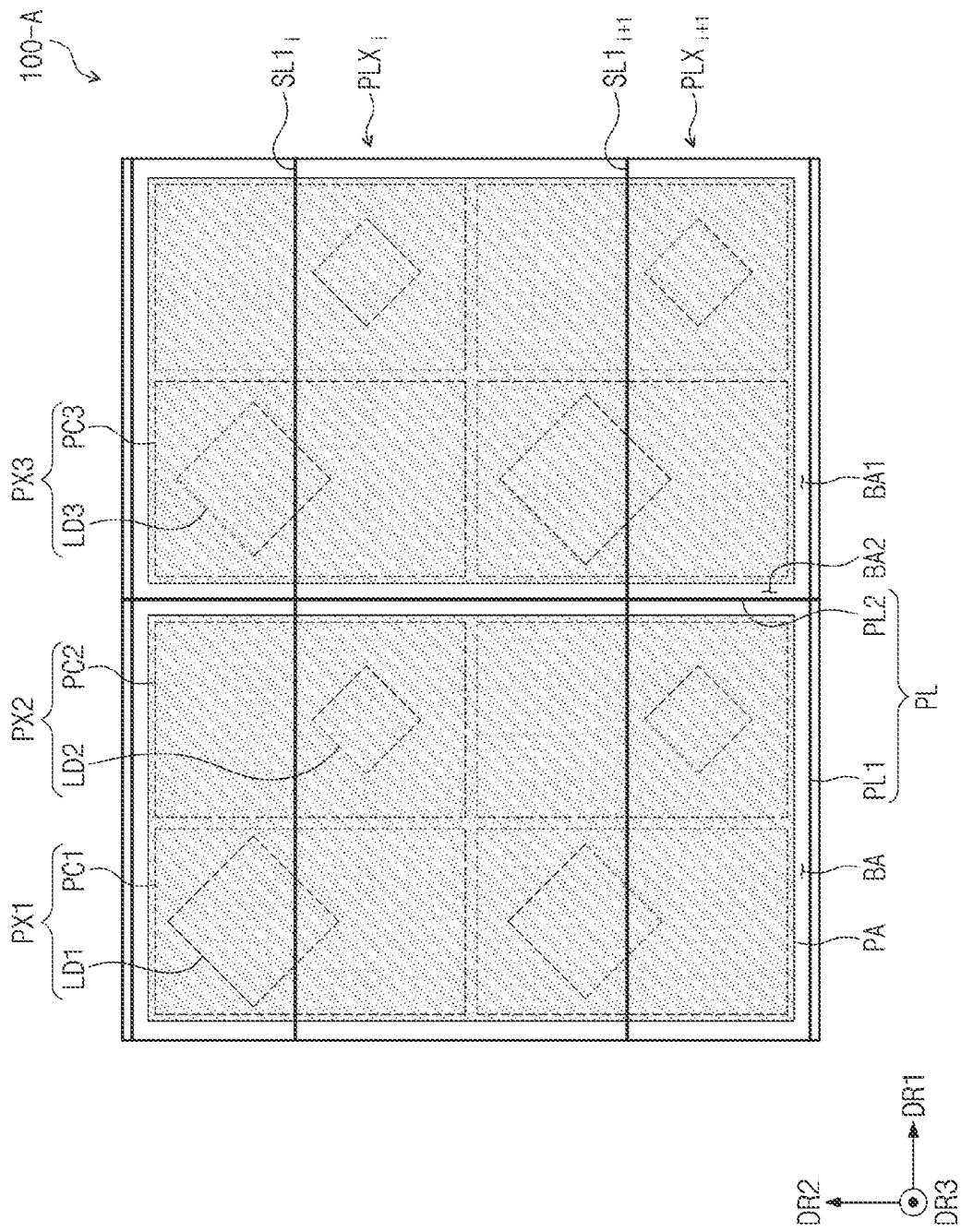

FIGS. 9A and 9B are enlarged plan views of a display region 100-A according to an embodiment of the inventive concept. Hereinafter, a detailed description of the same configuration as that described with reference to FIGS. 1 to 6B will be omitted.

Each of the pixel regions PA may include a plurality of pixels PX1, PX2, and PX3. As illustrated in FIG. 9A, first and second color pixels PX1 and PX2 may be disposed in one pixel region PA, and second and third color pixels PX2 and PX3 may be disposed in another pixel region PA. As illustrated in FIG. 9B, one first color pixel PX1, one third color pixel PX3, and two second color pixels PX2 may be disposed in one pixel region PA.

Figure 10:
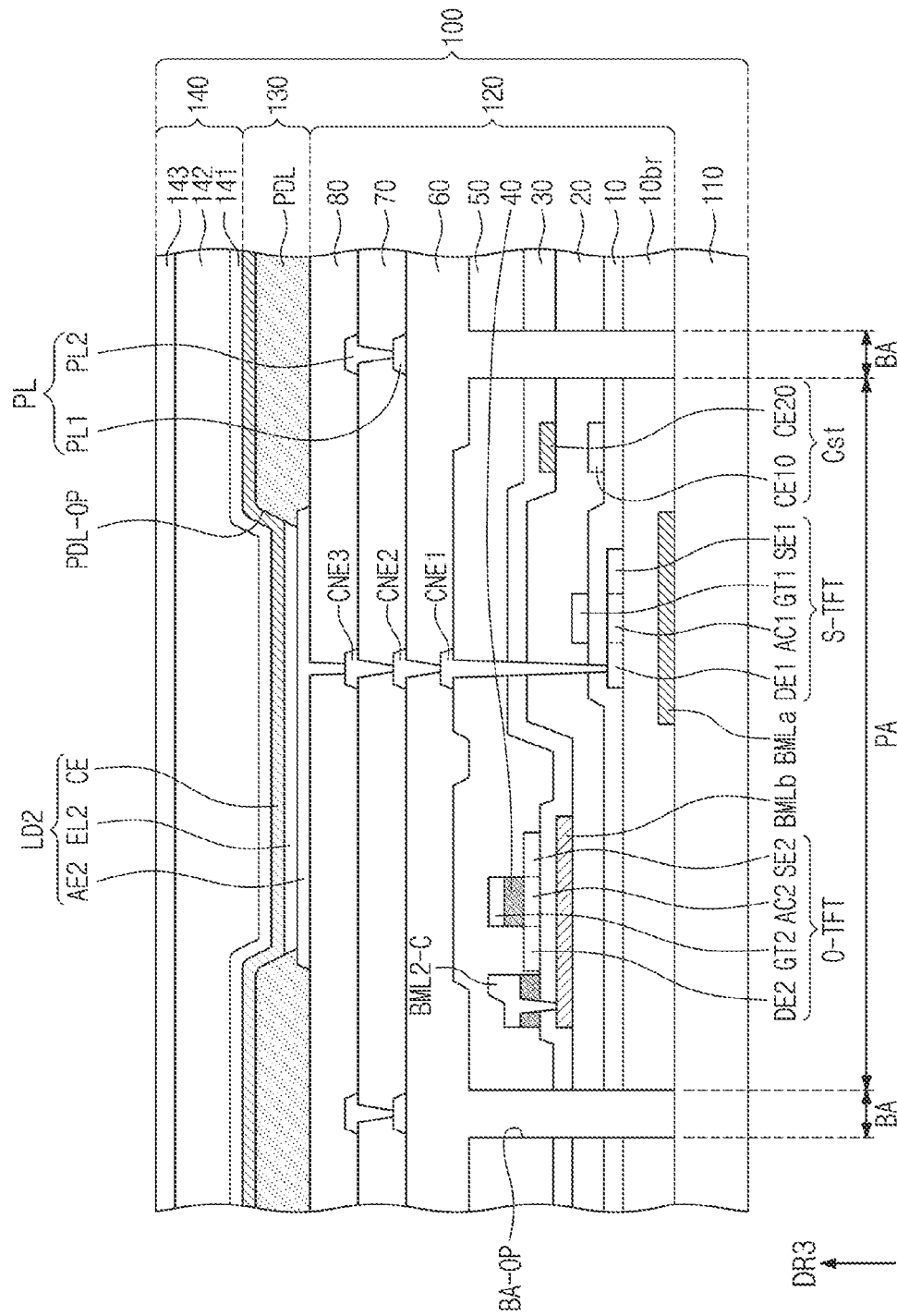
FIG. 10 is a cross-sectional view of a display panel according to an embodiment of the inventive concept.

FIG. 10 is a cross-sectional view of a display panel 100 according to an embodiment of the inventive concept. Hereinafter, a detailed description of the same configuration as that described with reference to FIGS. 5A and 5B will be omitted.

The fourth insulating layer 40 may be disposed on the third insulating layer 30. As illustrated in FIG. 5A, the fourth insulating layer 40 may overlap the gate GT2 and the contact electrode BML2-C of the oxide transistor O-TFT and expose a region which does not overlap the gate GT2 and the contact electrode BML2-C of the oxide transistor O-TFT. The source region SE2 and the drain region DE2 of the oxide transistor O-TFT may be exposed from the insulating pattern of the fourth insulating layer 40.

Figure 11A:
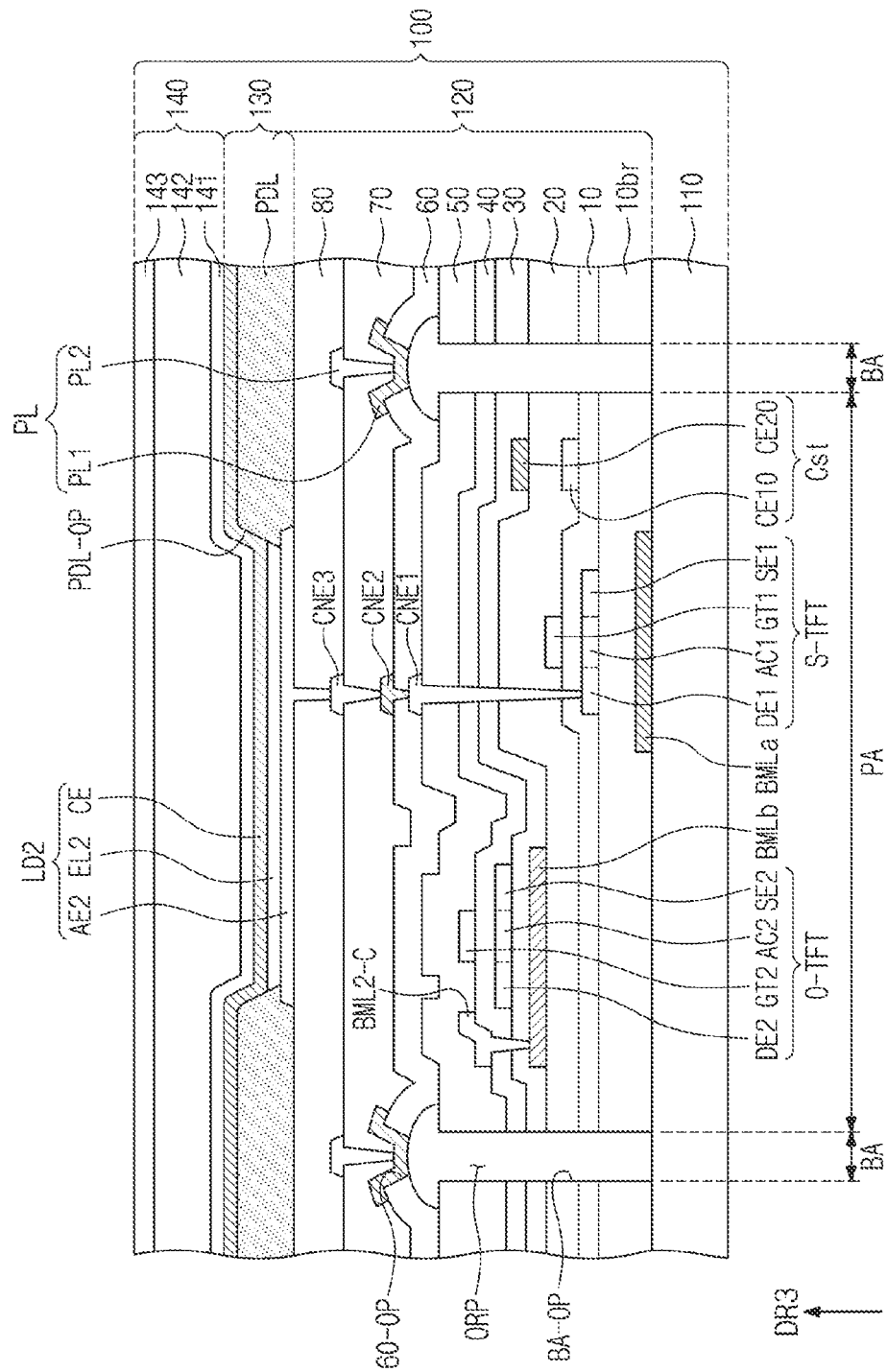
FIGS. 11A and 11B are cross-sectional views of display panels according to an embodiment of the inventive concept.
Figure 11B:
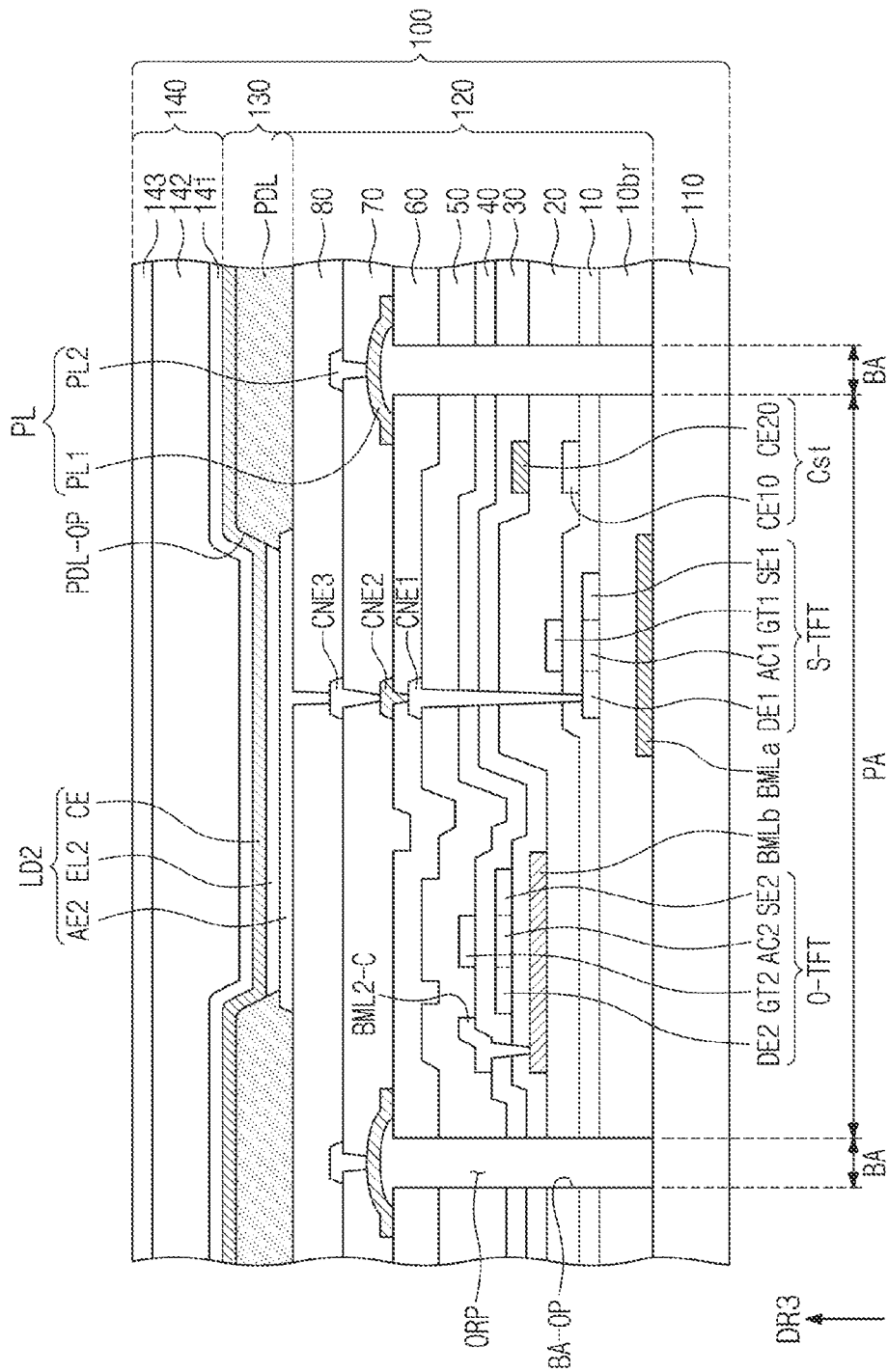

FIGS. 11A and 11B are cross-sectional views of display panels 100 according to an embodiment of the inventive concept. Hereinafter, a detailed description of the same configuration as that described with reference to FIGS. 5A and 5B will be omitted.

As illustrated in FIGS. 11A and 11B, the display panels 100 may include an organic pattern ORP configured to fill the opening BA-OP. The organic pattern ORP may have the same shape as that of the opening BA-OP in a plan view. The organic pattern ORP may have a lattice shape in a plan view.

As illustrated in FIG. 11A, the sixth insulating layer 60 covering the organic pattern ORP is disposed on the fifth insulating layer 50. An opening 60-OP exposing the organic pattern ORP is defined in the sixth insulating layer 60. The sixth insulating layer 60 may be an organic layer or an inorganic layer. When the sixth insulating layer 60 is an inorganic layer, it is possible to reduce the size of a contact hole disposed in the pixel region PA, for example, the contact hole disposed between the second connection electrode CNE2 and the first connection electrode CNE1.

The first power line PL1 is disposed on the sixth insulating layer 60. The first power line PL1 may be disposed inside the opening 60-OP of the sixth insulating layer 60 so as to come in contact with the organic pattern ORP. The second power line PL2 may be connected to the first power line PL1 through a contact hole formed through the seventh insulating layer 70.

As illustrated in FIG. 11B, the sixth insulating layer 60 is disposed on the fifth insulating layer 50. The sixth insulating layer 60 may be an organic layer or an inorganic layer. The opening BA-OP may extend to the sixth insulating layer 60. A portion of the organic pattern ORP may be disposed on the upper surface of the sixth insulating layer 60 to fill the opening BA-OP.

The first power line PL1 may be disposed on the organic pattern ORP, and the first power line PL1 may be partially disposed on the upper surface of the sixth insulating layer 60. The second power line PL2 may be connected to the first power line PL1 through a contact hole formed through the seventh insulating layer 70.

According to the above description, the boundary region may divide the display region into a plurality of pixel regions. The stack structure of inorganic layers is divided into island-shaped stack structures. The island-shaped stack structure is disposed in each pixel region. The stack structure of inorganic layers may improve the impact resistance of the display panel when compared to the stack structure of inorganic layers formed in common in the display region.

The opening of the inorganic layers formed in the boundary region is filled with an organic material. The organic material forms an organic pattern or an organic layer. A conductive line may be disposed on the organic pattern or the organic layer. The conductive line may be a signal line or a voltage line. By securing a region, in which the conductive line is to be disposed, outside the pixel region, the designing of a pixel circuit in the pixel region may be carried out more freely.

Although the above has been described with reference to embodiments of the present inventive concept, those skilled in the art or those of ordinary skill in the art will understand that the present inventive concept may be variously modified and changed within the scope not departing from the spirit and technical scope of the present inventive concept described in the claims to be described later.

Therefore, the technical scope of the present inventive concept should not be limited to the contents described in the detailed description of the specification, but should be determined by the claims below.

What is claimed is:

1. A display panel comprising:
   a base layer comprising a boundary region and a pixel region;
   a pixel circuit disposed in the pixel region to overlap the pixel region;
   a plurality of insulating layers disposed on the base layer, the plurality of insulating layers including an opening disposed in a region corresponding to the boundary region;
   a first organic layer disposed on the plurality of insulating layers to fill the opening;
   a light-emitting element overlapping the pixel region, electrically connected to the pixel circuit, and disposed on the first organic layer;
   a first conductive line entirely disposed inside of the opening in a plan view on the first organic layer and electrically connected to the pixel circuit;
   a second organic layer disposed on the first organic layer; and
   a second conductive line entirely disposed inside of the opening in a plan view on the second organic layer,
   wherein the second conductive line is connected to the first conductive line through a contact hole entirely disposed inside of the opening in a plan view through the second organic layer.

2. The display panel of claim 1, wherein:
   the boundary region comprises a first region extending in a first direction and a second region extending in a second direction crossing the first direction;
   the opening comprises a first opening region extending in the first direction to overlap the first region and a second opening region extending in the second direction to overlap the second region; and
   the first conductive line extends in the first direction or in the second direction.

3. The display panel of claim 2,
   wherein:
   the first conductive line extends in the first direction; and
   the second conductive line extends in the second direction.

4. The display panel of claim 2,
   wherein:
   the first conductive line is disposed in the first region to overlap the first opening region;
   and the second conductive line is disposed in the second region to overlap the second opening region.

5. The display panel of claim 2, further comprising:
   a third conductive line disposed on the first organic layer; and
   a fourth conductive line disposed on the second organic layer,
   wherein the first conductive line, the second conductive line, the third conductive line and the fourth conductive line are disposed in the boundary region which are different from each other.

6. The display panel of claim 5, wherein the first conductive line and the second conductive line receive signals or voltages which are different from signals or voltages the third conductive line and the fourth conductive line receive.

7. The display panel of claim 1, wherein the pixel circuit comprises a silicon transistor or an oxide transistor.

8. The display panel of claim 1, wherein the first conductive line receives a data signal or a power voltage.

9. The display panel of claim 1, further comprising a data driving circuit electrically connected to the first conductive line,
   wherein:
   the boundary region comprises a first region extending in a first direction and a second region extending in a second direction crossing the first direction;
   the opening comprises a first opening region extending in the first direction to overlap the first region and a second opening region extending in the second direction to overlap the second region; and
   the first conductive line comprises a first line disposed in the first region to overlap the first opening region and a second line disposed in the second region to overlap the second opening region.

10. The display panel of claim 1, wherein:
    the pixel region includes a plurality of pixel regions;
    the boundary region surrounds each of the plurality of pixel regions in a plan view; and
    a number of the light-emitting element disposed in each of the plurality of pixel regions is one, two, or four.

11. The display panel of claim 1, further comprising a scan line,
    wherein the scan line comprises:
    a first conductive pattern overlapping the pixel region and disposed under the first organic layer; and
    a second conductive pattern overlapping the boundary region, disposed on the first organic layer, and electrically connecting to the first conductive pattern.

12. The display panel of claim 1, wherein:
    the pixel circuit comprises a first transistor including a first gate and a silicon semiconductor pattern, and a second transistor including a second gate and an oxide semiconductor pattern; and
    the plurality of insulating layers comprise:
    a buffer inorganic layer disposed under the silicon semiconductor pattern;
    a first inorganic layer disposed on the silicon semiconductor pattern;
    a second inorganic layer disposed on the first inorganic layer and the first gate;

a third inorganic layer disposed between the second inorganic layer and the oxide semiconductor pattern;

a fourth inorganic layer disposed on the third inorganic layer and the oxide semiconductor pattern; and a fifth inorganic layer disposed on the fourth inorganic layer and the second gate.

13. The display panel of claim 12, wherein the fourth inorganic layer disposed under the second gate to overlap the second gate, the fourth inorganic layer exposing the first transistor.

14. A display panel comprising:

a base layer comprising a boundary region and a pixel region;

a pixel circuit disposed in the pixel region to overlap the pixel region;

a plurality of inorganic layers disposed on the base layer, the plurality of inorganic layers including an opening disposed in a region corresponding to the boundary region;

an organic pattern disposed on the plurality of inorganic layers to fill the opening;

a first conductive line disposed on the organic pattern and electrically connected to the pixel circuit;

a second organic layer disposed on the organic pattern;

a second conductive line entirely disposed inside of the opening in a plan view on the second organic layer; and a light-emitting element overlapping the pixel region, electrically connected to the pixel circuit, and disposed on the second organic layer, wherein an upper surface of an uppermost inorganic layer among the plurality of inorganic layers is exposed from the organic pattern, and wherein the second conductive line is connected to the first conductive line through a contact hole entirely disposed inside of the opening in a plan view through the second organic layer.

15. The display panel of claim 14, further comprising an insulating layer disposed on the plurality of inorganic layers, the insulating layer including a first opening exposing the organic pattern, wherein the first conductive line is disposed to cover the first opening.

16. The display panel of claim 14, wherein a portion of the organic pattern is disposed on the uppermost inorganic layer among the plurality of inorganic layers.

17. The display panel of claim 16, wherein the first conductive line is in contact with an upper surface of the organic pattern.

18. The display panel of claim 14, wherein the first conductive line and the second conductive line cross each other.

19. A display panel comprising:

a base layer comprising a first pixel region, a second pixel region, and a boundary region disposed between the first pixel region and the second pixel region;

a first stack structure disposed corresponding to the first pixel region;

a second stack structure disposed corresponding to the second pixel region and spaced apart from the first stack structure with an opening disposed in a region corresponding to the boundary region between the first stack structure and the second stack structure;

a first organic layer which fills the opening;

a transistor and a light-emitting element which are disposed in the first pixel region;

a first conductive line entirely disposed inside of the opening in a plan view on the first organic layer and electrically connected to the transistor or the light-emitting element;

a second organic layer disposed on the first conductive line; and a second conductive line entirely disposed inside of the opening in a plan view on the second organic layer, wherein each of the first stack structure and the second stack structure comprises a plurality of inorganic layers, the first conductive line extends in a first direction, and the boundary region extends in the first direction, and wherein the second conductive line is connected to the first conductive line through a contact hole entirely disposed inside of the opening in a plan view through the second organic layer.

* * * * *